US008456159B2

(12) United States Patent  
Polzer et al.

(10) Patent No.: US 8,456,159 B2  
(45) Date of Patent: Jun. 4, 2013

(54) STABILIZATION SYSTEM FOR SENSORS ON MOVING PLATFORMS

(75) Inventors: Benjamin David Polzer, Ontario (CA); Gordon Fox West, Ontario (CA); Peter Whyte Walker, Ontario (CA); Peter Anthony Hurley, Ontario (CA); Robert Leslie Scott Hogg, Ontario (CA)

(73) Assignee: Vale S.A., Rio de Janeiro RJ (BR)

( * ) Notice: Subject to any disclaimer, the term of this patent is extended or adjusted under 35 U.S.C. 154(b) by 812 days.

(21) Appl. No.: 12/688,565

(22) Filed: Jan. 15, 2010

(65) Prior Publication Data

US 2011/0175604 A1 Jul. 21, 2011

(51) Int. Cl.
*G01R 33/02* (2006.01)
(52) U.S. Cl.
USPC ........... 324/246; 324/253; 324/247; 324/330; 324/323; 324/245; 324/331; 324/326; 324/329; 324/332; 324/334; 324/244; 324/336; 324/344; 324/95; 324/350; 324/335; 343/705; 343/707; 343/708; 343/719; 73/152.47; 73/152.32; 73/152.15; 73/57; 73/493; 73/430; 73/431; 73/496; 33/304; 33/300; 33/361; 33/363 R; 33/363 Y
(58) Field of Classification Search
USPC ................ 324/253, 247, 330, 323, 245, 246, 324/331, 326, 329, 332, 334, 244, 336, 344, 324/95, 350, 335; 343/705, 707, 708, 719; 73/152.47, 152.32, 152.15, 57, 493, 430, 73/431, 496; 33/361, 363 R–363 Y, 304, 33/300
See application file for complete search history.

(56) References Cited

U.S. PATENT DOCUMENTS 2,715,951 A * 8/1955 Lieber ........................... 188/378
2,811,042 A * 10/1957 Kenyon ......................... 74/5.22
3,167,966 A * 2/1965 Ashleman ....................... 73/497

(Continued)

OTHER PUBLICATIONS

Sherry et al., "Performance of Automotive-Grade MEMS Sensors in Low Cost AHRS for General Aviation", Digital Avionics Systems Conference, 2003, vol. 2, pp. 1-5.*

(Continued)

*Primary Examiner* — Patrick Assouad
*Assistant Examiner* — Lamarr Brown
(74) *Attorney, Agent, or Firm* — Arent Fox LLP

(57) ABSTRACT

A stabilized field sensor apparatus collects field data, in particular magnetic field data, with reduced motion noise. The apparatus includes a tear drop shaped housing, a tow frame in the housing, a plurality of vibration isolating dampers spaced around the frame, a base assembly mounted to the dampers, a support pedestal having a bottom end fixed to the base assembly and an upper free end, a single spherical air bearing connected to the upper free end of the pedestal, an instrument platform with a lower hollow funnel having an upper inside apex supported on the air bearing for a one point support, principal and secondary gyro stabilizers for maintaining pivotal and rotational stability, and at least one field sensor mounted to the instrument platform for collecting the field data while being stabilized against motion noise including vibration, pivoting and rotation from the base assembly, from the tow frame and from the housing. Stabilization of the instrument platform is enhanced by preserving accurate balance through a dynamic balancing system whereby small masses are moved under computer control to maintain the center of mass of the instrument platform at the center of rotation of the spherical air bearing. The dynamic stabilization process is made more precise by actively vibrating the instrument platform by a set of linear vibrators.

21 Claims, 11 Drawing Sheets

U.S. PATENT DOCUMENTS

| | | | |
|---|---|---|---|
| 3,240,075 A * | 3/1966 | Ranes | 74/5.5 |
| 3,423,755 A * | 1/1969 | Ward et al. | 343/705 |
| 3,460,148 A * | 8/1969 | Podraczky | 343/705 |
| 3,553,700 A * | 1/1971 | Miller et al. | 343/705 |
| 3,742,358 A * | 6/1973 | Cesaro | 455/9 |
| 4,628,266 A * | 12/1986 | Dzwinel | 324/330 |
| 4,629,990 A * | 12/1986 | Zandee | 324/330 |
| 5,025,262 A * | 6/1991 | Abdelrazik et al. | 343/705 |
| 5,117,695 A * | 6/1992 | Henderson et al. | 73/493 |
| 5,686,836 A * | 11/1997 | Sasada et al. | 324/244 |
| 5,804,722 A * | 9/1998 | Van Kann et al. | 73/382 G |
| 6,175,341 B1 * | 1/2001 | Noir et al. | 343/915 |
| 6,244,534 B1 * | 6/2001 | Klinkert | 244/1 TD |
| 6,369,573 B1 * | 4/2002 | Turner et al. | 324/331 |
| 6,462,549 B1 * | 10/2002 | Curtis et al. | 324/323 |
| 6,651,496 B2 * | 11/2003 | Van Steenwyk et al. | 73/152.03 |
| 6,765,383 B1 * | 7/2004 | Barringer | 324/330 |
| 6,816,788 B2 * | 11/2004 | Van Steenwyk et al. | 702/9 |
| 6,883,372 B2 * | 4/2005 | van Leeuwen et al. | 73/382 G |
| 7,002,349 B2 * | 2/2006 | Barringer | 324/330 |
| 7,157,914 B2 * | 1/2007 | Morrison et al. | 324/330 |
| 7,298,869 B1 * | 11/2007 | Abernathy | 382/108 |
| 7,375,529 B2 * | 5/2008 | Dupuis et al. | 324/331 |
| 7,397,417 B2 * | 7/2008 | Jackson | 342/22 |
| 7,859,259 B2 * | 12/2010 | Heiland | 324/253 |
| 8,289,023 B2 * | 10/2012 | Kuzmin et al. | 324/345 |
| 2002/0092350 A1 * | 7/2002 | Etkin et al. | 73/382 G |
| 2003/0110852 A1 * | 6/2003 | Golly et al. | 73/180 |
| 2003/0169045 A1 * | 9/2003 | Whitton | 324/330 |
| 2009/0206204 A1 * | 8/2009 | Rosen | 244/158.5 |

OTHER PUBLICATIONS

Bartholomeyczik et al., "MEMS IMU for AHRS applications", Position, Location and Navigation Symposium, 2008, pp. 225-231.*

* cited by examiner

STABILIZATION SYSTEM FOR SENSORS ON MOVING PLATFORMS

FIELD AND BACKGROUND OF THE INVENTION

The invention relates generally to the field of sensor supports, and, in particular, to a new and useful magnetometer stabilization device that facilitates continuous collection of broad-band vector magnetic field data including unique low frequency magnetic measurements in the bandwidth of 1 Hz to 25 Hz, without being affected by motion noise. The invention is particularly useful for mineral resource prospecting using active or passive electromagnetic techniques from air, land or water borne vehicles.

The problem addressed by the invention is the continuous vector measurement of time-varying magnetic fields in the 1 Hz to over 10 kHz frequency range by sensors mounted in a transportable housing towed by an aircraft (often called a bird, a drone or a sonde) or mounted on a land or water vehicle. The magnetic field of interest is created as a result of electromagnetic induction (EMI) by currents at these frequencies flowing through the Earth. They are induced there either by a "Primary" magnetic signal from a transmitter and antenna (controlled-source systems) or by natural time-varying geomagnetic fields produced in or reflected from the earth's ionosphere (passive or natural field systems). These induced fields are extremely weak in comparison to the steady geomagnetic field possessed by the Earth. On a stationary platform, the weak time-varying components are easily distinguished from the strong geomagnetic field, but on a moving platform, rotational motions of a vector sensor in a steady field will create variations in sensor output that may be indistinguishable from the time-varying fields produced by electromagnetic induction. The portion of the sensor output due to rotations is generically called "motion noise" even though strictly it is the rotation and not the linear acceleration of the sensor that causes it.

A variety of devices have been employed in geophysical exploration that exploit EMI to detect zones of enhanced electrical conductivity ("Conductors") in the Earth and to characterize the time-varying nature of electrical conductivity in the earth ("Polarizability") through the observed magnetic fields. Such EMI measurements are often diagnostic of mineral and petroleum deposits, lithological and structural variations in ground, aquifers and contamination plumes, and man-made objects such as fences, pipelines, ordnance and treasure. A common attribute of most EMI geophysical systems is a need to measure weak, time varying magnetic fields; and many employ a set of three sensors, each sensitive to the component of the field in a different direction (often orthogonal) to reconstruct the complete time-varying magnetic field vector.

The problem the invention is designed to overcome occurs in all cases where a magnetic sensor is fixed to a housing that moves through a static or low frequency field like that of the Earth's. While linear accelerations are not a problem, rotational acceleration of the sensor creates a time varying signal which is in addition to what would be obtained if the sensor were held in a fixed orientation. While the current invention is intended to be deployed in a housing towed from an aircraft, it could be useful in all situations when vector component magnetic field data are acquired from any mobile vehicle since a static background field is always present. Such vehicles include spacecraft, aircraft, ground and subterranean vehicles, marine and submarine vehicles, or any passive or active drone or platform towed from or attached to such a vehicle. The invention also applies to magnetic field sensors at a fixed location where rotational motion may otherwise be introduced by such effects as vibration, or where the magnetic field is to be measured on a moving part, such as on a piece of machinery.

Many sensor technologies are available for sensitive continuous measurement of magnetic fields. Those most suitable for use in EMI measurement systems are vector sensors that record one spatial component of the magnetic field over a specified range of frequencies, possibly (or not) including long term steady field components like the Earth's geomagnetic field. In what follows, we shall use the term magnetometer or sensor for any of these sensor types, despite the fact that this term is sometimes applied to mean only instruments suitable for measuring the essentially steady geomagnetic field, and that magnetometers for sensing time-varying fields often utilize electromagnetic induction in coils and may therefore sometimes not be referred to as magnetometers.

In the invention contemplated herein, the housing of the sensor system is typically towed behind or under an aircraft along traverse lines. In existing state-of-the art devices towed in this way, the sensors are supported within their housings on passively damped suspensions. The damping and restoring forces in these suspensions have the competing roles of reducing rotational noise while roughly maintaining the orientation of the sensors relative to the housing and the tuning of these suspensions represents a compromise between the two roles. At frequencies much below 25 Hz, such suspensions do not provide sufficient rotational isolation to permit useful EMI measurements. Accordingly, attempts using existing systems to lower operating frequencies much below 25 Hz have resulted in unacceptable noise levels.

As will be explained later in this disclosure, the present invention uses a fairly conventional outer vibration isolation system to reduce the linear and rotational accelerations but adds to this an inner system for rotational isolation with essentially no damping or restoring forces to produce new, advantageous and unexpected advantages over the prior art.

There are a number of methods that have been applied to assist in rotationally-stabilizing instrument platforms of all kinds, including active and passive gyroscopic methods, low-friction, highly-balanced gimbals, and spherical bearings. In airborne geophysics, gyro stabilized platforms have been used in measuring airborne gravity and gravity gradients, and separate patents exist for these technologies. However these systems focus on eliminating linear accelerations rather than rotational accelerations. For EMI measurements, it is the rotational accelerations that are more problematic. The inner isolation system focuses on eliminating these by combining three independent techniques; un-damped single-point suspension, dynamic balancing and inertial gyroscopic stabilization.

The problem of orientation stabilization is shared by the cinema industry where cameras mounted on moving platforms may be subject to unwanted rotations that render the images unusable. The present invention borrows the basic technique of gyro stabilization as developed by that industry. However, stabilization methods used in the cinematic industry are not precise enough and are also problematic for our purpose. Accordingly, the techniques are refined in two main ways. Firstly, the stabilization is made more precise so as to achieve the necessary noise level for useful EMI measurement by the design of the mount and the means by which the assembly it carries is balanced. Secondly, additional magnetic shielding techniques are employed to minimize the effects of electromagnetically-noisy cinematic stabilization equipment on the ultra-sensitive magnetic sensors.

In addition, there are well known linear motion-isolation technologies, including flotation, air bearings, bungee suspension, combinations of springs and shock absorbers and schemes for active signal compensation. Linear motion-isolation can also improve rotational stability by reducing the torques on the platform that result from the application of those linear accelerations to an imperfectly balanced instrumentation platform. Likewise, rotational stability is further enhanced by improvements in platform balance.

The invention contemplated herein is different from existing devices in at least three ways that will become apparent later in this disclosure. First, in its rotational isolation solution, it dispenses with the restoring forces and damping used in existing systems. Instead, the sensors are fastened to a rigid instrument platform that is allowed to float freely on a single spherical air bearing. Thus, the assembly is free to rotate in any direction about a precise centre of rotation and can maintain its orientation relative to the static background geomagnetic field of the earth even while the housing of the platform turns beneath it. This approach recognizes that it is unimportant to maintain the direction of the instrumentation package relative to the housing as long as provision is made that the suspension can be kept within its mechanical range of operation. Independent AHRS (attitude and heading recording) systems are commercially available and are used in this invention to keep track of the orientation of the sensors relative to the housing and relative to the geographic reference frame. Without the damping friction and restoring forces inherent in existing motion isolation systems, the invention is capable of dramatically improving the low frequency noise caused by rotational jitter of the housing.

A second way in which the invention contemplated herein differs from existing devices is that it deals with the problem of dynamic imbalance of the instrumentation platform by incorporating a dynamic balancing system which maintains the centre of mass of the instrumentation platform precisely at its center of rotation. This system is a novel design that uses active members vibrating at fixed frequencies to assess the level of rotational noise induced by the action of each vibrator in each sensor. It uses this information to adjust balance masses in a feedback loop so as to achieve minimal noise.

A third way in which the invention differs from existing devices is that it allows additional resistance to rotation to be incorporated by the addition of several gyro stabilizers (borrowed from the cinema industry) while dealing with the problems of using such electromagnetically noisy devices in close proximity to sensitive EMI sensors.

An industry exists for routine measurement of electromagnetic induction from aircraft. This industry has provided a number of commercial controlled-source systems including the Geotem, Spectrum and Tempest systems which operate from fixed-wing aircraft and Heli-Geotem, VTEM (see U.S. Pat. No. 7,157,914 to Morrison et al.), Aerotem, THEM, Skytem and the Dighem type systems which are towed below helicopters. These all suffer from rotational noise problems to one degree or another, all employ some form of passive sensor rotation control using restoring forces and dampers of one form or another. None of these use gyro stabilization. None of them operate at frequencies below 25 Hz because the motion-induced noise is too high.

Passive (natural field) airborne electromagnetic measurements suffer from the same susceptibility to motion-induced noise as controlled-source systems at lower frequencies. They were first made by Ward with the AFMAG system (Geophysics, Vol. XXIV, No. 4 (October, 1959), pp. 761-789). More recently, passive measurements have been made with the ZTEM system which according to Geotech operates in the 30-6000 Hz frequency band. See "Field Tests of Geotech's Airborne AFMAG EM System," Lo, et al., AESC Conference, Melbourne, Australia, 2006. VLF-EM is a passive EM system common to many airborne surveys. VLF-EM operates above 10 kHz. In the VLF band, motion noise is not important because the orientation of the aircraft is stable at these frequencies.

U.S. Pat. No. 6,765,383 to Barringer (2002) describes an airborne magnetotelluric survey system operating in the range of 3 to 480 Hz using a towed bird. Few geophysicists believe Barringer's system could ever work. In that system, the magnetic field is measured with a total field magnetometer and 3 orthogonal axis induction coils. A standard commercial angular motion sensor of limited sensitivity is used to record the bird motion and compensate the signal for angular changes in coil orientation. However, the motion of the bird was not separated from the motion of the coils. U.S. Pat. No. 7,002,349 (2006) also to Barringer describes a similar wingtip system.

U.S. Pat. No. 4,629,990 to Zandee (1986) describes the use of low frequency (sub 30 Hz) EM fields for correcting the relative locations of a transmitter and receiver in controlled source airborne systems, but discounts the possibility of using the low frequency data for measuring electromagnetic scattering due to currents induced in the Earth.

Non-electromagnetic airborne geophysical measurements are made from inertially stabilized platforms. Sander Geophysics' Airgrav airborne gravity system measures gravity from a 3-axis Schuler-tuned inertially stabilized platform. U.S. Pat. No. 6,883,372 to van Leeuwen et al. discloses similar technology in a gravity gradiometer of BHP Billiton Innovation Pty Ld. of Melbourne, Australia. Other airborne gravity/gravity gradiometer systems are operated by Bell Geospace, Arkex and New Resolution Geophysics. A gravity gradiometer developed by RTZ is described in U.S. Pat. Nos. 5,804,722 and 5,668,315 to Van Kann et al.

In a different application, U.S. Pat. No. 7,298,869 to Abernathy describes a gyro-stabilized airborne multi-spectral earth imaging system.

U.S. Pat. No. 6,816,788 to Van Steenwyk et al. (2003), describe an inertially stabilized magnetometer measuring apparatus for use in a borehole rotary environment. In this patent, magnetic and gravity component measurements are made in a borehole. The magnetic sensors measure the components of the magnetic field orthogonal to the axis of the hole, and a gyroscope is used to sense inertial angular motion about the borehole axis. The purpose of the gyroscopes is to provide an inertial reference to measure angular rotation data. This inertial reference is used to correct measurements for the rotation of the probe, or to provide a reference to control a rotary drive mechanism which causes the sensors to maintain a stable orientation. A similar patent, U.S. Pat. No. 6,651,496 to Van Steenwyk et al., describes the use of gyroscopes to obtain rotation information for a probe in a borehole so that the rotation information can be used to correct the orientation of the sensors. In both these cases, only the static magnetic field of the earth was measured, and not the magnetic fields caused by time-varying currents flowing in the Earth.

U.S. Pat. No. 6,369,573 to Turner et al., assigned to The Broken Hill Proprietary Company Limited of Australia (BHP-2002), discloses a towed-bird for use in electromagnetic mineral prospecting that uses a method for reducing sensor rotation. The objective of this patent is similar to the current effort, but the approach uses passive isolation methods with a restoring force (springs) and a damper (fluid). This BHP device consists of two nested spherical shells. Liquid is contained between the inner and outer shells and a sphere has openings through which support strings project for locking to an internal point within the sphere. The strings have one end connected to an internal point within the support sphere and another end connected to a spring. The spring includes a damper for damping movement of the spring. Baffles are arranged in the cavity between the inner and outer shells in which the liquid is contained for damping movement of the liquid.

U.S. Pat. No. 5,117,695 to Henderson et al. (1995) uses a related concept for damping and describes a method for a vibration attenuation employing an assembly designed for the protection of single axis instruments such as accelerometers using a damping fluid.

Other recent electromagnetic prospecting patents have been awarded to Dupius et al. (see U.S. Pat. No. 7,375,529) who uses multiple cores to increase the amount of magnetic flux gathered by a magnetometer.

Jackson describes an invention in U.S. Pat. No. 7,397,417 (2008) that is a passive geophysical prospecting apparatus that uses a magneto-resistive sensor in the 65 kHz-12 kHz range.

Klinkert's U.S. Pat. No. 6,244,534 describes an airborne prospecting system which uses a streamlined bird with manipulated attitude-control surfaces to house a transmitter. The pitch of the bird can be controlled by multiple tow ropes, and the receiver can be either in the same bird or in a separate bird. The bird optionally has a motor and separate propeller.

Whitton et al.'s published patent application US 2003/0169045, describes a method for measuring on-time airborne EM measurements by using a rigid transmitter loop and a separate rigid bucking & receiver coil assembly. Their invention employs passive damping.

Many patents exist for self-contained gyroscopic stabilizers. The devices used in the embodiment described here are manufactured by Kenyon Laboratories and work on the principles described in the 1957 U.S. Pat. No. 2,811,042 to Theodore Kenyon.

SUMMARY OF THE INVENTION

The invention is made up of four principal mechanical systems, a number of ancillary systems involving pneumatic, mechanical, electronic and computing devices and a number of algorithms for optimizing performance.

Mechanical Systems:

The invention uses four nested and coupled mechanical systems. Each of the systems has a different function with respect to mechanical isolation. The inner-most of these is the rotation-stabilized instrumentation platform which bears the sensors and the data acquisition system. The outermost system is a housing which is roughly tear drop in shape. Its function is to protect the inner systems from the atmospheric elements and to provide a shape for towing which will present a minimum of turbulence-induced vibration above 1 Hz. The housing will likely utilize control surfaces such as fins to trim its flight characteristics however these are not central to the function and novelty of the invention and have been omitted from the drawings.

The housing is coupled to the tow frame. The tow frame bears the innermost two systems and it is coupled to the housing through a horizontal, rotatable axis which allows the tow frame to maintain its pitch angle while changes occur in the angle of attack of the housing during flight. The essential structural component of the tow frame is a roughly horizontal circular ring which supports all the inner systems through a set of vibration isolation dampers. The dampers significantly reduce vibration transmitted to the inner systems from aerodynamic turbulence and from variations in tension in the tow cable.

Internal to the tow frame is the base assembly, a basket-shaped structure attached to the tow frame through the vibration dampers. The purpose of the base assembly is to provide a support from beneath for the single-pivot-point-air bearing that supports the instrumentation platform in a position where the center of mass of the combined two inner systems will be located roughly in the center of the tow frame's circular ring.

The inner-most structure is the instrumentation platform which has the form of an inverted funnel. It is coupled to the base assembly through a single spherical air bearing located at the top of a pedestal attached to the base assembly. The bearing is virtually frictionless. Aided by the platform's high moment of inertia and its almost perfectly balance in all three directions about the point of rotation of the bearing it provides an extremely high level of rotational decoupling between the base assembly and the instrumentation platform. It has about 25 degrees of angular free travel in the roll and pitch directions about support column and has an complete freedom in yaw. It can float totally freely, as there are no power, air or other mechanical connections linking it to the outside.

Ancillary Systems:

Pneumatic—The principal air bearing as well as a number of actuating devices on the base assembly operate on compressed air at 80-100 pounds per square inch pressure. The feed for these systems is an air line which is not shown in any of the drawings. The air line originates at or below the tow vehicle and it enters the housing through one of the rotatable axles which also serve as the pickup points for the tow cables. The air line will be conducted from the tow frame to the base assembly allowing enough slack to accommodate any relative motions induced by the vibration dampers.

Gyro Stabilizers—The invention includes three gyro stabilizers located on the instrumentation platform. Each of these is packaged with its own battery pack and inverter within a magnetic shield.

Data Acquisition System—The invention includes a 4-channel data acquisition system located on the instrumentation platform. The system accepts analogue inputs from three vector-component magnetometers as well as a PPS (pulse-per-second) signal from a GPS and transmits these to a wireless router located on the tow platform. The data link will be along a LAN cable from the tow platform to the tow vehicle.

Embedded Computer—The invention includes an embedded computer located on the instrumentation platform. It has the dual role of controlling the position of the balance masses and transmitting data from the AHRS device wirelessly to the wireless router located on the tow frame.

Dynamic Balancing System:

The invention includes a dynamic balancing system comprised of:
a) three linear vibrators oriented orthogonally and located on the base assembly just beneath the air bearing;
b) three linear actuators oriented orthogonally to each other and located on the instrumentation platform; and
c) an embedded computer for controlling the positions of the balance masses, acquiring data from an AHRS device incorporating a flux gate magnetometer and communicating with a PC in the tow vehicle via a wireless link with the wireless router on the tow frame.

The balancing system works by providing an artificial vibration at three fixed frequencies in each of the three vibration directions. The magnetic data from the primary sensors will sense the action of these vibrations if the instrumentation platform is not perfectly balanced. A non-linear optimization algorithm will operate on the PC based in the tow vehicle and it will send commands to the embedded computer to optimize the mass balance of the instrumentation platform. The algorithm provides for the maintenance of a slight bias in the balance so as to maintain the attitude of the platform in a roughly vertical orientation thus keeping it from reaching its limits in roll and pitch.

The various features of novelty which characterize the invention are pointed out with particularity in the claims annexed to and forming a part of this disclosure. For a better understanding of the invention, its operating advantages and specific objectives attained by its uses, reference is made to the accompanying drawings and descriptive matter in which preferred embodiments of the invention are illustrated.

DESCRIPTION OF THE PREFERRED EMBODIMENTS

Figure 1A:
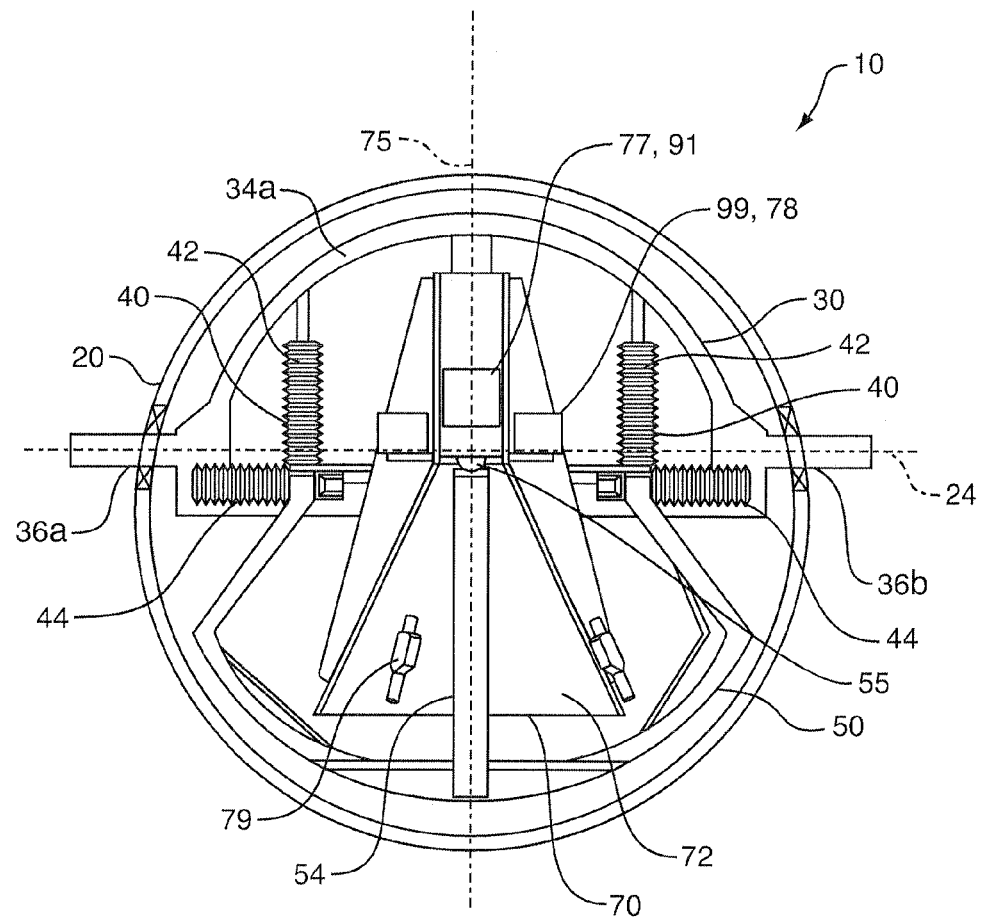
FIG. 1A is a cross-sectional view of a stabilization system according to a preferred embodiment of the present invention.

Principal Utility of the Invention:

The present invention is a new airborne bird containing several component systems. Together with its interior systems and while it is being towed from a helicopter or other aircraft, the bird measures three-component magnetic field data across a wide range of frequencies, especially including the low frequency band from 1 Hz to 25 Hz. The principal application of the invention is in geophysical exploration to detect zones of enhanced electrical conductivity ("Conductors") in the Earth and to characterize the time-varying nature of electrical conductivity in the earth ("Polarization") through the observed magnetic fields. These time-varying magnetic fields are often diagnostic of mineral and petroleum deposits, lithological and structural variations in ground, aquifers and contamination plumes, and man-made objects such as fences, pipelines, ordnance and treasure.

The present invention is the first device which will allow a user to harness the significant Schumann resonance in the ambient geomagnetic signal for exploration purposes by operating with sufficiently low noise at frequencies below 10 Hz. It will also offer a significant advantage over other airborne systems in areas of the penetration of conductive overburden and the discrimination of highly conducive mineral deposits. The design is also considered to be a stepping stone towards the realization of an airborne EM system capable of routine detection of induced polarization anomalies.

The apparatus of the invention is typically towed along traverse lines behind or under an aircraft for airborne, low-frequency magnetic surveying using passive and/or controlled-source EMI systems. However, as described here, it is only a receiver and does not include a description of the transmitter or antenna. However the described receiver system can be adapted to work as the receiver in a controlled-source system towed from a single aircraft, can be used in a tandem-aircraft configuration in which one aircraft tows the transmitter and a second aircraft tows the receiver, or in a configuration using a fixed transmitter located on the ground.

Additionally, the apparatus of the invention can also be mounted on or in various moving platforms. For example, it can be used on or in a spacecraft, aircraft, ground based or subterranean vehicles, ships, boats, rafts, barges, buoys or in submersible vehicles.

The apparatus of the present invention incorporates a number of different strategies for rotational isolation of the instrument platform and the device can be used for a number of electromagnetic sensing tasks. However, not all of these tasks require the same degree of precision in terms of rotational isolation. So for example, it may turn out, that the use of the air bearing alone, with no gyros and with no dynamic balancing system may be sufficient to allow for magnetic data to be collected from a transmitter towed along with the system because in this case the signals sought are sufficiently large, whereas to collect viable natural field data (no transmitter) may require the balancing as well as the gyros to be functioning.

While the device provides for the stabilization of a magnetometer for unique low frequency magnetic measurements, it is applicable to stabilizing other devices such as gravimetric, optical receiving (camera/telescope), laser pointing— against rotational motion. Additionally, if used to stabilize an electromagnetic transmitter, the device will prevent the transmitted signal from being modulated by attitude variations of the transmitting platform.

Figure 1B:
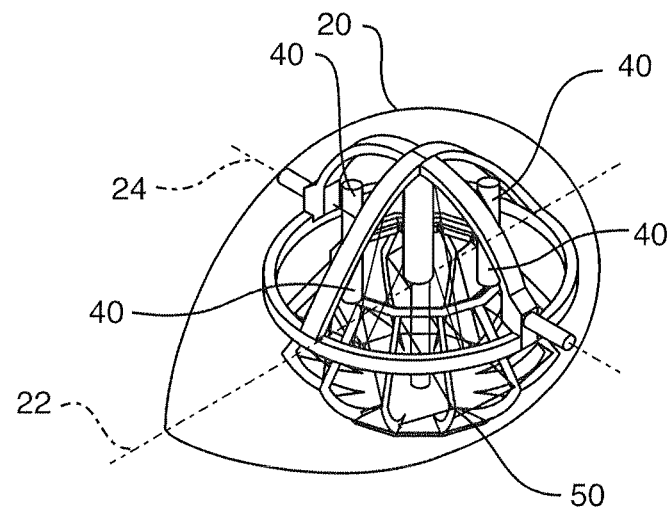
FIG. 1B is a perspective view of the stabilization system of FIG. 1A, with its housing transparent so that underlying structures are visible.
Figure 1C:
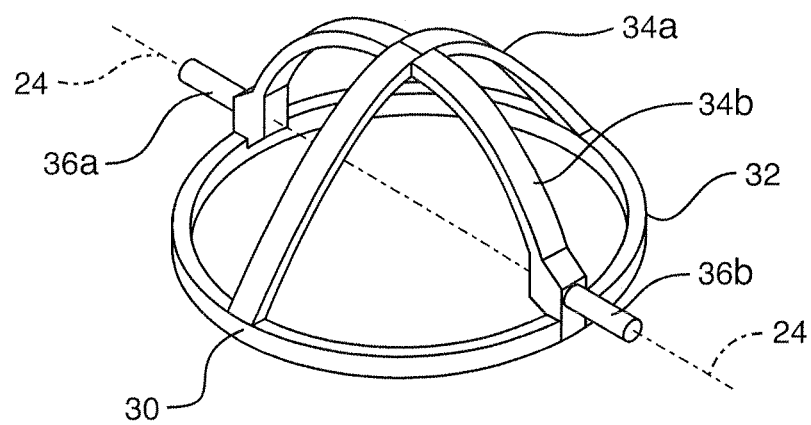
FIG. 1C is a perspective view of a tow frame according to the preferred embodiment of the invention illustrated in FIG. 1A.

Physical Description:

Referring to the drawings, in which like reference numerals are used to refer to the same or similar elements, FIG. 1A and FIG. 1B show a preferred embodiment of the stabilization system 10 for airborne or other vehicular magnetometers and other moving platforms. As illustrated in FIGS. 1A to 1C, the entire "bird" or sonde 10 of the invention is for collecting electromagnetic induction (EMI) data with reduced motion noise. The apparatus comprises an aerodynamic, e.g. tear drop shaped housing 20 having a bulbous, preferably spherical front portion, a pointed rear end, a first front-to-back horizontal axis 22 and a second side-to-side horizontal axis 24 that is preferably above the central horizontal axis of the housing 20 so that more of the overall weight of the housing 20 and its contents is below the axis 24 than is above it. A tow frame 30 is provided in the bulbous end of the housing 20. The tow frame 30 has a base ring 32, two crossing arcuate, e.g. circular bars 34a, 34b each with opposite ends connected at equally spaced locations to and around the base ring 32.

Two horizontal axles 36a, 36b laying on the second horizontal axis 24 of the housing 20, protrude from opposite ends of one of the bars 34a, the axles protruding from opposite sides of the base ring 32 and out through opposite sides of the bulbous portion of the housing 20 for attaching the apparatus to a vehicle, e.g. a helicopter, by means of a cable and a two point pickup (not shown). The axles 36a and 36b are pivotally connected to the housing 20 and the frame 30 has a size and shape to allow for free relative rotation of the frame 30 in the housing 20 about the second horizontal axis 24. In this way, when the apparatus 10 is lifted by an airborne vehicle, by its axles 36a and 36b, the housing 20 will tend to pivot with its pointed end down but will not apply torque to the inner systems which can maintain their roughly upright orientation. As the vehicle begins to move forward, the air flow around the housing 20 will tend to lift the pointed end until it becomes the trailing end of the housing 20. A teardrop shaped housing 20 with the bulbous end forward has been found to have the most aerodynamic shape for the most voluminous interior volume and was selected for the housing shape for that reason although other aerodynamic shapes may be used.

As best shown in FIGS. 1A and 1B, two pairs of vibration isolating dampers 40 are each connected to one of the bars 34a and 34b, and are spaced around the tow frame 30, each damper pair being effective for damping vertical and horizontal vibrations of the tow frame 30. A base assembly 50 is mounted to the vibration isolating dampers 40 and is positioned at least partly in the tow frame 30 and entirely in the bulbous portion of the housing 20, for free movement of the base assembly 50 in the housing 20 when the tow frame 30 pivots about the second horizontal axis 24 of the housing 20. Vertical and horizontal vibrations of the housing 20 and frame 30 are thereby dampened by the dampeners 40 before reaching the base assembly 50.

Figure 2A:
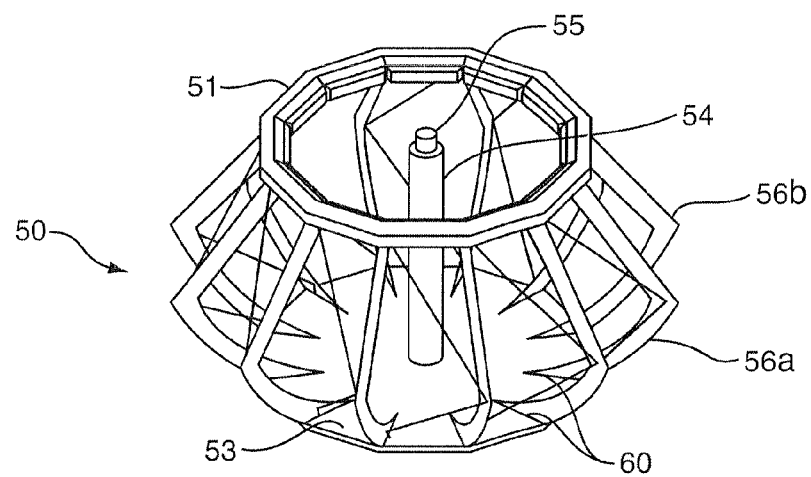
FIG. 2A is a top perspective view of a base assembly of the embodiment shown in FIG. 1A.
Figure 2B:
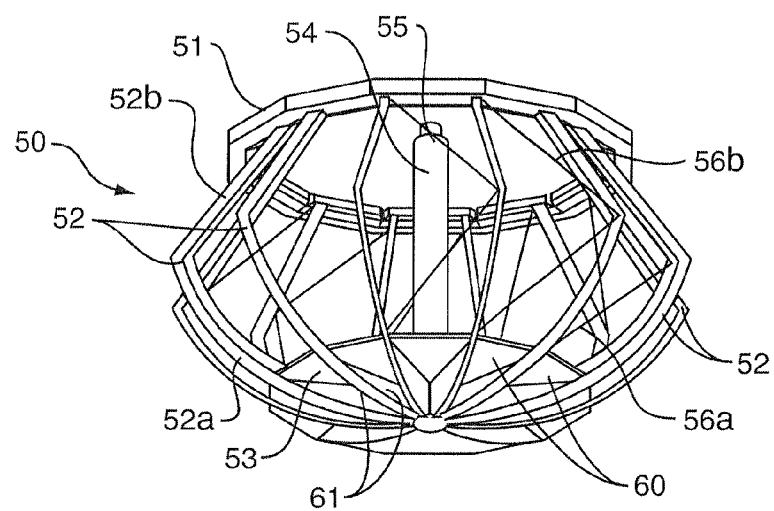
FIG. 2B is a bottom perspective view of the base assembly of FIG. 2A which shows the bottom of a base plate of the base assembly.
Figure 2C:
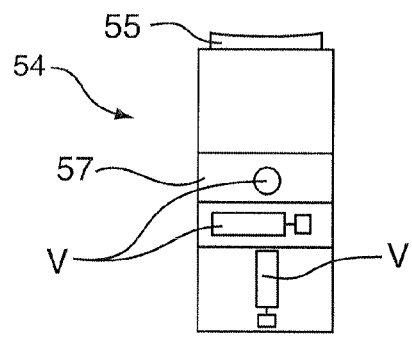
FIG. 2C is a schematic view of the inside of the support pedestal in FIGS. 2A and 2B showing the vibrating pneumatic tri-axial actuators. The source of compressed air or gas is not shown.
Figure 3A:
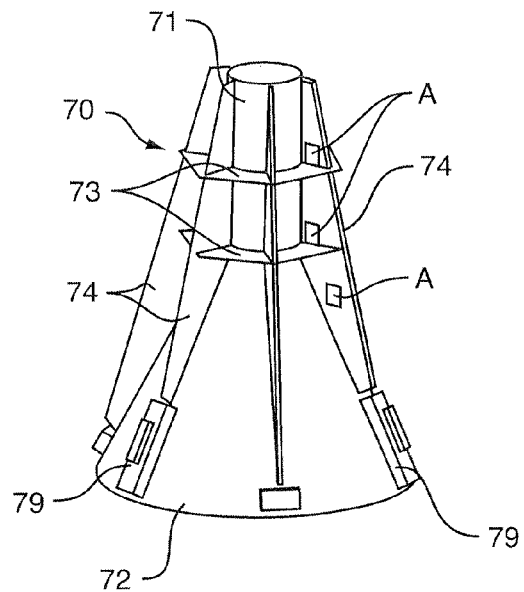
FIG. 3A is a perspective view of the instrument platform in the embodiment of FIG. 1A
Figure 5A:
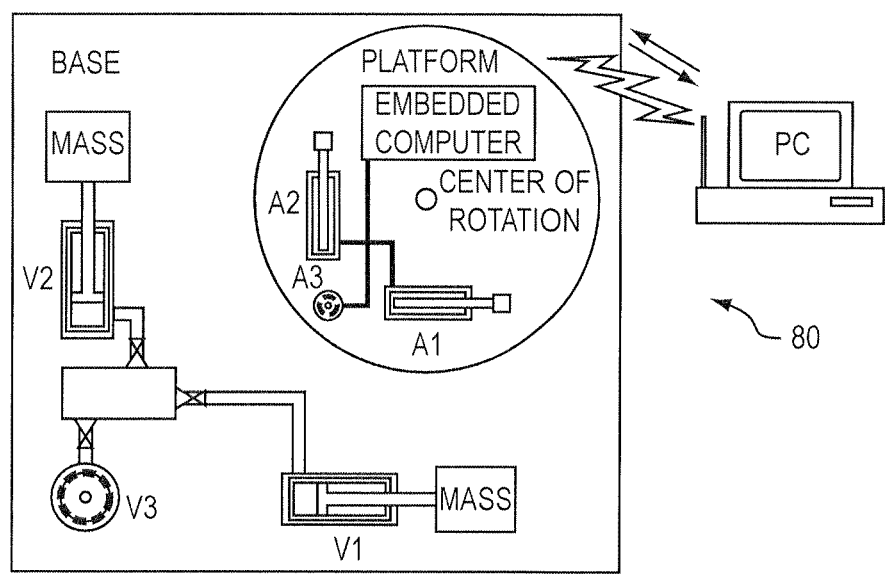
FIG. 5A is a schematic illustration of the dynamic balancing system of the invention.
Figure 6A:
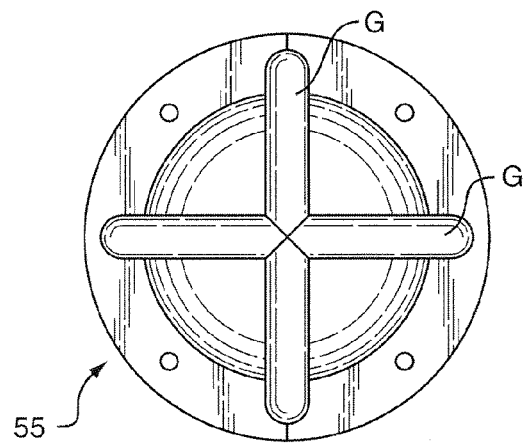
FIG. 6A is a top view of the supported hemisphere of the spherical air bearing.
Figure 6B:
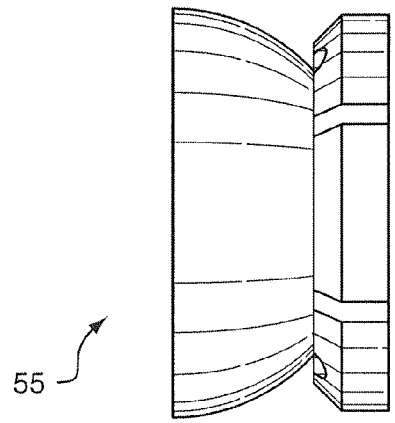
FIG. 6B is a sectional side view of the spherical air bearing.
Figure 6C:
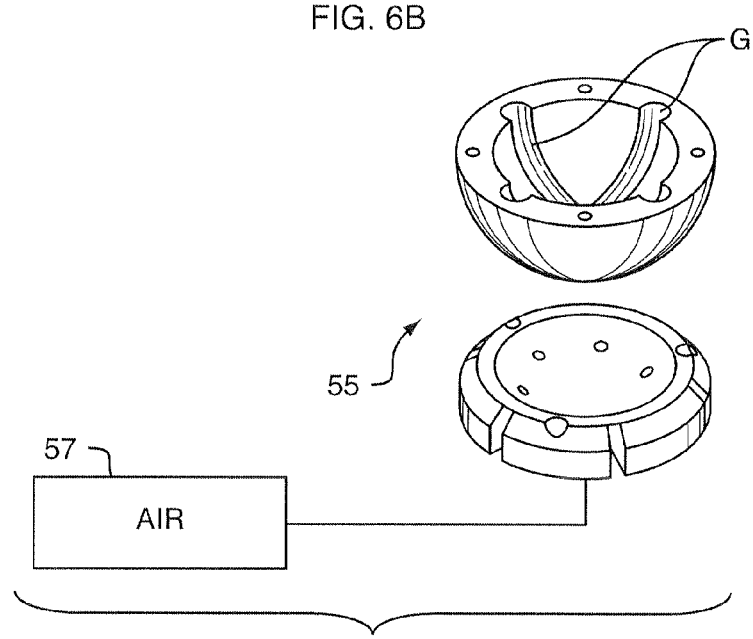
FIG. 6C is a perspective exploded view of the spherical air bearing assembly.

As shown in FIGS. 2A and 2B, a support pedestal 54 has a bottom end fixed to the base assembly 50 near a bottom of the base assembly 50, the support pedestal 54 extending upwardly in the base assembly 50 and into the tow frame 30 and having an upper free end centered on the tow frame 30. A single spherical air bearing 55 that will later be disclosed in greater detail with reference to FIGS. 6A to 6C is connected to the upper free end of the pedestal 54. A module comprising three linear pneumatic vibrators V in FIG. 2C or V1, V2 and V3 in FIG. 5A, oriented at right angles, i.e. in the respective X, Y and Z directions, to one another is contained within the pedestal 54 as shown in FIG. 2C. As shown in FIGS. 1A and 3A, an instrument platform 70 having a lower hollow cone portion 72 with an upper inside apex is engaged to and supported on the spherical air bearing 55. The instrument platform 70 also has an upper stem 71 extending upwardly of the cone portion 72, above the apex and into the tow frame 30. The instrument platform's central axis 75 extends through the cone portion 72 and the stem 71. The air bearing 55 provides for virtually frictionless rotation of the instrumentation platform axis 75 direction, referred to as "pivotal rotation" or "roll and pitch" as well as the rotation of the platform about its own axis 75 which is referred to as either "rotation" or "yaw".

Figure 4A:
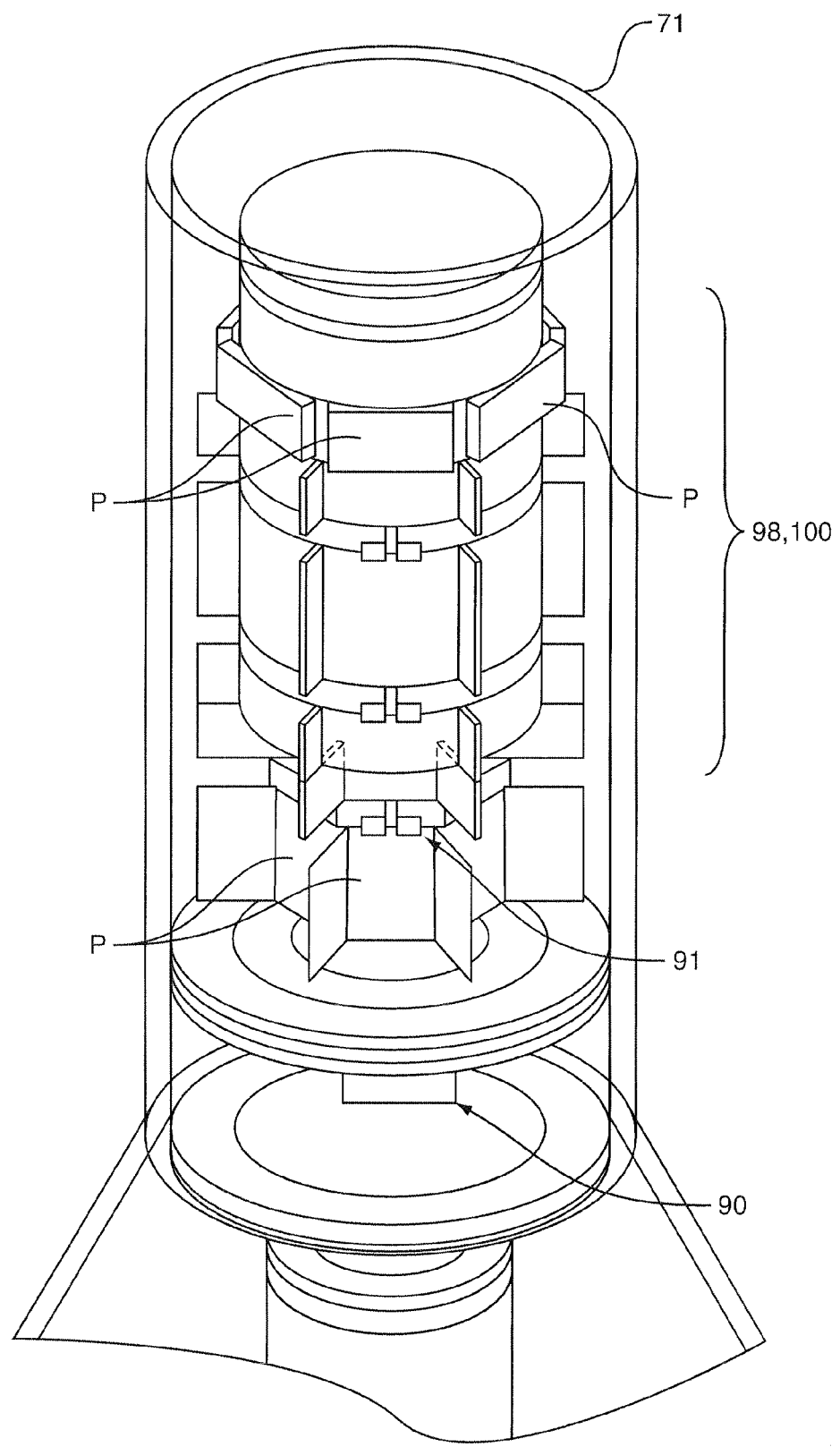
FIG. 4A is a perspective view of the stem portion of the instrument platform containing stacked instrument modules including the principal gyro stabilizer.

A principal gyro stabilizer 91 is mounted within the stem 71 of the instrument platform 70 as shown in FIG. 4A. The principal gyro stabilizer 91 is positioned on the central axis 75 for maintaining a fixed absolute orientation of axis 75 despite the changing orientation of the housing 20, at least within the pivot range of the instrument platform 70 that is preferably about 20 degrees, and in the range of about 10 to 30 degrees. This pitch range is dictated by the angle of the cone portion 71, and must be accommodated by the shape and size of the base assembly 50 as will be explained later.

It is noted that the use of the gyro stabilizers is preferred for the best results but that the invention can operate without them as well.

Figure 3B:
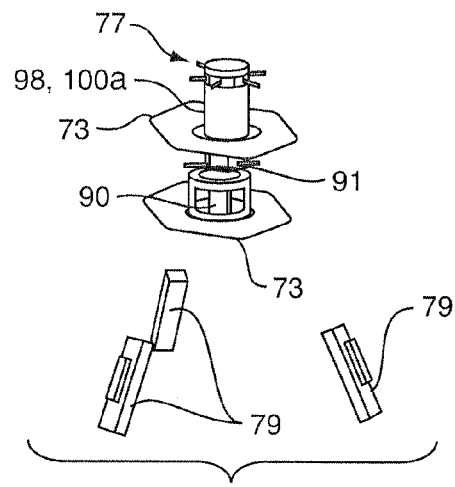
FIG. 3B is a perspective view showing active parts of the instrument platform with the platform structure removed to show the relative positions of the main field sensors and stacked instrument module of the invention.
Figure 3C:
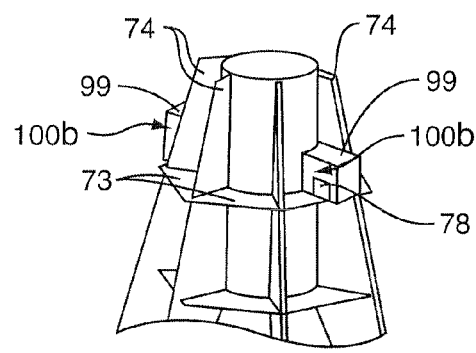
FIG. 3C is a partial perspective view of a stem portion of the instrument platform which shows the position of two secondary gyro stabilizer modules of the invention.

As shown in FIGS. 3A, and 3C, at least one, but preferably two weight-balanced secondary gyro stabilizers 78 are also mounted to the instrument platform 70, at locations spaced radially from the central axis 75 on opposite sides of the instrument platform 70, for maintaining a fixed absolute orientation of the respective stabilization axes each being orthogonal to axis 75.

As shown in FIGS. 3A and 3B, at least one, but preferable three equally spaced and inclined magnetic field sensors 79 are mounted to the instrument platform 70 for collecting field data while being stabilized against rotation from the base assembly 50, from the tow frame 60 and from the housing 20.

Referring once more to FIGS. 2A, 2B and 1B, the base 50 comprises a circular or polygonal suspension ring 51 connected to the four pairs of vibration isolating dampers 40, a circular or polygonal base plate 53 spaced below the suspension ring 51 and having a plurality of circumferential spaced radially extending slots 60, a plurality of base ribs 52 connected between the suspension ring 51 and the base plate 53 and spaced around the base plate and suspension ring. Each base rib 52 has a lower radially outwardly extending arcuate portion 52a extending near its bottom end through one of the slots 60 in the base plate 53, and an inwardly inclined portion 52b connected between the arcuate portion 56a of each respective base rib 52 and the suspension ring 51. The angle of the inclined portions 52b of the ribs 52, and the curvature of the arcuate portions 56a are each select to allow the instrument platform 70 to pivot and rotate on its axis 75 freely within its allowed range of motion in the base assembly 50.

A plurality of lower rod-like diagonal braces 56a are each connected between a lower end of one base rib 52, and an intermediate location of an adjacent base rib 52 around the base assembly 50, e.g. near the junction of the inclined portion 52b to the arcuate portion 56a of each rib 52. A plurality of upper rod-like diagonal braces 56b are also each connected between an upper end on each base rib 52 and the intermediate location on the adjacent base rib 52. These diagonal braces increase the torsional rigidity of the base assembly 50. The support pedestal 54 has an upper portion above the base plate 53 and a lower portion below the base plate 53, the lower end of each base rib 52 being connected to the lower portion of the support pedestal 54 below the base plate 53. A pair of reinforcing plates 61 on opposite sides of the portion of each base rib 52 below the base plate 53, further stiffens the ribs 52 in this area and the suspension ring 51, the ribs 52, the base plate 53 and the reinforcing plates 61, as well as the diagonal braces 56a and 56b, are each preferably made of sandwich cored carbon fiber composite for strength, light weight, and non-magnetic properties.

The stem portion 71 and the cone portion 72 of the instrument platform 70 each comprise a single piece of sandwich cored carbon composite material and, as best shown in FIGS. 3A, 3B, and 4A, the stem portion 71 contains a plurality of stacked instrument modules 77 including the principal gyro stabilizer 91, a data acquisition system 90 and a power module 98 which comprises an inverter and battery 100a. The instrument platform 70 also includes a plurality of circumferentially spaced vertical stiffening platform ribs 74 extending along the cone portion 72 and the stem 71, and a plurality of horizontal reinforcing flanges 73. The plurality of reinforcing flanges extend around the instrument platform 70 and have slots for receiving the platform ribs 74. The flanges 73 function as outboard platforms and one of them supports a pair of weight-balanced secondary gyro stabilizers 78 mounted within mu-metal shields located on opposite sides of the stem 71.

The apparatus preferably has three field sensors 79 that each comprise a magnetometer for collecting magnetic field data including low frequency magnetic measurements in a bandwidth of 1 Hz to 25 Hz, these three magnetometers 79 being mounted at equally spaced locations around the surface of the cone portion 72 adjacent a lower rim of the cone portion 72. Each magnetometer 79 is rigidly mounted to the cone portion 72 and includes a vector component having a longitudinal axis extending along the surface of the cone portion 72 in the direction of axis 75 and a component that is radial to axis 75. However, the apparatus will work when using any three sensors oriented in substantially different directions from each other.

Returning to FIG. 1A, the vibration isolating dampers 40 each comprise a vertical damper 42 that suspends the base assembly 50 from the arcuate bars 34a, 34b of the frame 30, and a horizontal damper 44 which laterally connects the base assembly 50 to the base ring 32 of the frame 30. In this embodiment they have been shown as mechanical devices incorporating a bellows, spring and damper but other arrangements are possible including the use of single-element dampers made of a visco-elastic polymer or an arrangement of bungee-cords. The base ribs 52 of the base assembly 50 are sized and angled to accommodate a 10 to 30 degree roll and pitch range of the instrument platform 70 on the spherical air bearing 55.

Figure 3D:
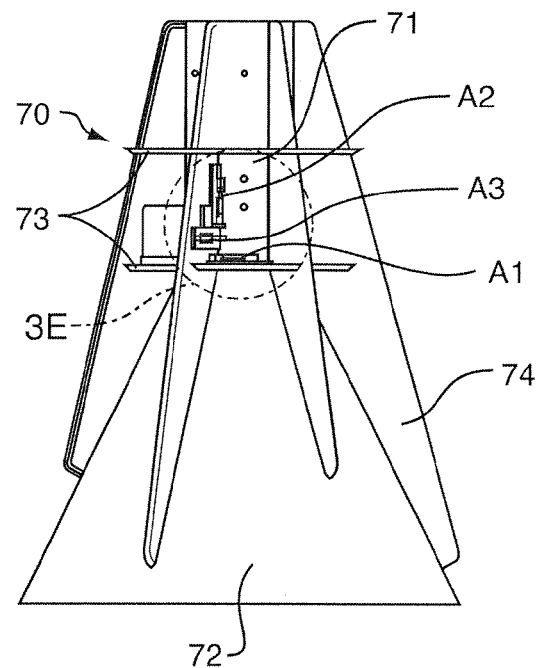
FIG. 3D is a side elevation of the platform.
Figure 3E:
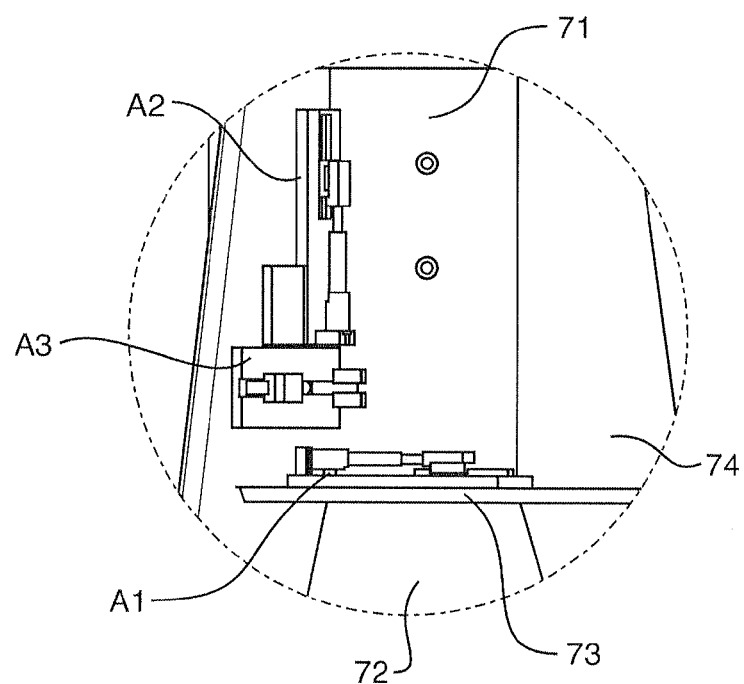
FIG. 3E is an enlarged detail taken at circle 3E from FIG. 3D.

Two Mu-metal shields 99 each contain a secondary gyro stabilizer 78, an inverter 100 and a battery 101 and are mounted to the instrument platform 70. The platform 70 further incorporates the actuators (A1,A2 and A3) of a dynamic balancing system 80 as shown in FIGS. 3D, 3E and 5A.

Referring now to FIGS. 1A and 1B, the invention is made up of the five major components introduced above, namely the housing 20, the tow frame ("frame") 30, the vibration isolating dampers ("dampers") 40, the base assembly ("base") 50 and the rotationally-stabilized instrument platform ("platform") 70.

As noted, FIG. 1B is a perspective view of the tear-drop-shaped housing 20 shown here as transparent so as to illustrate the layout of the inner components. It is to be about 3 m in diameter in its preferred form. The housing 20 is mechanically coupled to the frame 30 through bearings on two horizontal axles 36a and 36b located on either side of the frame 30 along the horizontal axis 24. This allows the housing 20 freedom to pitch independently of the frame 30 and all components attached to it. The ends of the axles 36a, 36b are the tow points for a two-point pickup of a helicopter or other aircraft. During takeoff and landing, or during changes in elevation associated with terrain-following, or changes in airspeed, this coupling will allow the housing 20 to adjust its angle of attack to that of lowest drag.

The cross section of FIG. 1A shows the two horizontal axles 36a and 36b that bear the entire load and are attached to the frame 30 and penetrate the housing 20 through the bearings around the corresponding openings in the housing 20. The platform 70 and base 50 are suspended from the frame 30 by the plurality of dampers 40 which comprises two kinds of dampers shown schematically as the bellows-like structures in the figures. The dampers 40 serve to isolate the base 50 from vibrations and rotations of the housing 20 due to time-varying aerodynamic loading as well as from time-varying tension in the tow cable. The goal is to provide a high degree of isolation in the 1 Hz to 10 Hz range and for this purpose several decimeters of vertical and horizontal displacement have been allowed for. The vertically-oriented dampers 42 have to bear the static load of the platform 70 and base 50, while the horizontal dampers 44 need only absorb the dynamic forces associated with lateral accelerations.

In FIGS. 2A and 2B, the vibration isolated base 50 is illustrated. The base 50 comprises the suspension ring 51 connected to the plurality of vibration isolating dampers 40 and the base plate 53 which is connected to the suspension ring 51 by the plurality of base ribs 52. The base 50 further comprises the support pedestal 54 which has a bottom end that is connected to the top surface of and at the center of the base plate 53. The support pedestal 54 also has a top end opposite the end which is connected to the base plate 53. Positioned on the opposite top end of the support pedestal 54 is the single spherical air bearing 55. The support pedestal 54 is for supporting the rotationally-stabilized instrumentation platform 70 of FIG. 3A.

The base 50 is a cage-like structure of ribs 52 which connects the suspension ring 51 with the pedestal 54. It is advantageously constructed of a light carbon fiber sandwich core construction like that used to construct the platform 70. Components of the base structure 50 which link the support pedestal 54 through the base plate 53, the ribs 52 to the suspension ring 51 are also made of light carbon fiber sandwich core construction. Moreover, the entire structure can be made from sandwich-cored carbon fiber to keep its weight low while maintaining good rigidity. The diagonal braces 56a and 56b in carbon fiber tubing are designed to increase torsional rigidity as also noted.

The platform 70 is seen in section in FIG. 1A and in perspective in FIG. 3A. It is a sandwich cored carbon composite funnel-shaped structure which sits in an inverted fashion on the spherical air bearing 55 supported by the pedestal 54. Achieving a high degree of rigidity in the platform 70 was a critical goal because it carries the gyros 91, 78 for attitude stabilization as well as the three vector component magnetometers which are the primary sensors 79. The maintenance of a fixed relative orientation of these components to the level of millionths of a degree over the acquisition bandwidth of the magnetometers 79 is essential to the success of the magnetic field measurements.

In a preferred embodiment, the platform 70 is constructed of a single piece carbon composite structure. It is funnel-shaped and manufactured of sandwich-core carbon composite measuring roughly 1.5 m across the base and 2 m high. The two parts of the funnel are the stem portion ("stem") 71 and the cone portion ("cone") 72. The platform ribs 74 provide additional rigidity. The principal gyro stabilizer 91 is mounted inside the stem 71 as shown best in FIG. 4a and must stabilize the sensors 79 mounted near the lower rim of the cone 72. For this reason the platform 70 needs to be stiff enough that its deformations are negligible (<1.0e-7 Radians). While stiffness would be greatly enhanced by reducing the size of the structure, large physical dimensions are required to physically separate the gyro-stabilizers 91, 78 (which are sources of electromagnetic noise) from the magnetic field sensors 79. FIGS. 3B and 3C show the relative positions of these electronic components.

The stem 71 contains a series of stacked instrument modules 77 comprising the data acquisition system 90, followed by the principal gyro stabilizer 91, followed by its power module 98 which contains an inverter and battery 100a. These modules are positioned so that the ones that create most electromagnetic noise are located farthest from the sensors 79. In addition, there are two outboard platforms 73 oriented perpendicular to the stem 71. These allow attachment of the secondary additional gyros 78 each contained in a separate shield 99 that stabilize for rotations around the funnel axis 75, a motion that is not restrained by the principal axial gyro stabilizer 91.

The instruments carried by the platform 70 as well as the platform 70 itself have six major roles; to sense the magnetic fields, to sense the platform's 70 orientation, to stabilize the platform 70 against rapid small changes in orientation (jitter), to stabilize the platform 70 against systematic orientation drift, to digitize and transmit data to an off-platform computer, and to keep the platform 70 as balanced as is possible so that the center of mass is coincident with the center of rotation of the air bearing 55.

Primary Sensors:

In the preferred embodiment of the invention, three magnetometers 79 serve as the primary field sensors which can sense vector components of magnetic fields. The three magnetometer sensors 79 are each mounted to the surface of the cone near its rim with their sensitive long axes coplanar to the central axis 75. They are distributed about the central axis every 120 degrees in azimuth. Cables (not shown) run from the sensors 79 to the base of the stem 71 along the joint of the plurality of vertically stabilized platform ribs 74. The sensors 79 are custom designed by a supplier for this application and are based on a feedback magnetic-induction principle. They have a flat pass band between 1 Hz and 10 kHz with a sensitivity of 0.1V/nT. They have a noise floor of 0.1 pT/sqrt(Hz) at 1 Hz and of 5 fT/sqrt(Hz) at 300 Hz, but the invention can utilize any high-sensitivity vector component magnetometer.

While the preferred embodiment uses feed-back magnetic induction coils, useful measurements can be made with several different kinds of sensors such as induction coils, flux gate magnetometers or any device that measures spatial magnetic field components, their time derivatives, or quantities that are related to the magnetic field by a linear filter.

Data Acquisition System:

The present invention further comprises a four channel 24-bit data acquisition system (DAQ) 90. The DAQ 90 is used to sample the primary sensors 79 at up to 51 kS/s and includes GPS time stamping and a wireless link to an off-platform PC.

Principal Gyro Stabilizer Module:

Referring now to FIG. 3B and FIGS. 4A to 4C, the principal gyro stabilizer (PGS) 91 is a commercial Kenyon KS-12 gyro stabilizer as used in the cinema industry. It is comprised internally of twin rotors each mounted on a single degree-of-freedom gimbal. It is driven by a 400 Hz 220V drive signal derived through an inverter from a 28V DC source. The PGS 91 is cylindrical and it resists rotation about any axis perpendicular to its own axis but it provides no resistance to rotations about its own axis.

Figure 4B:
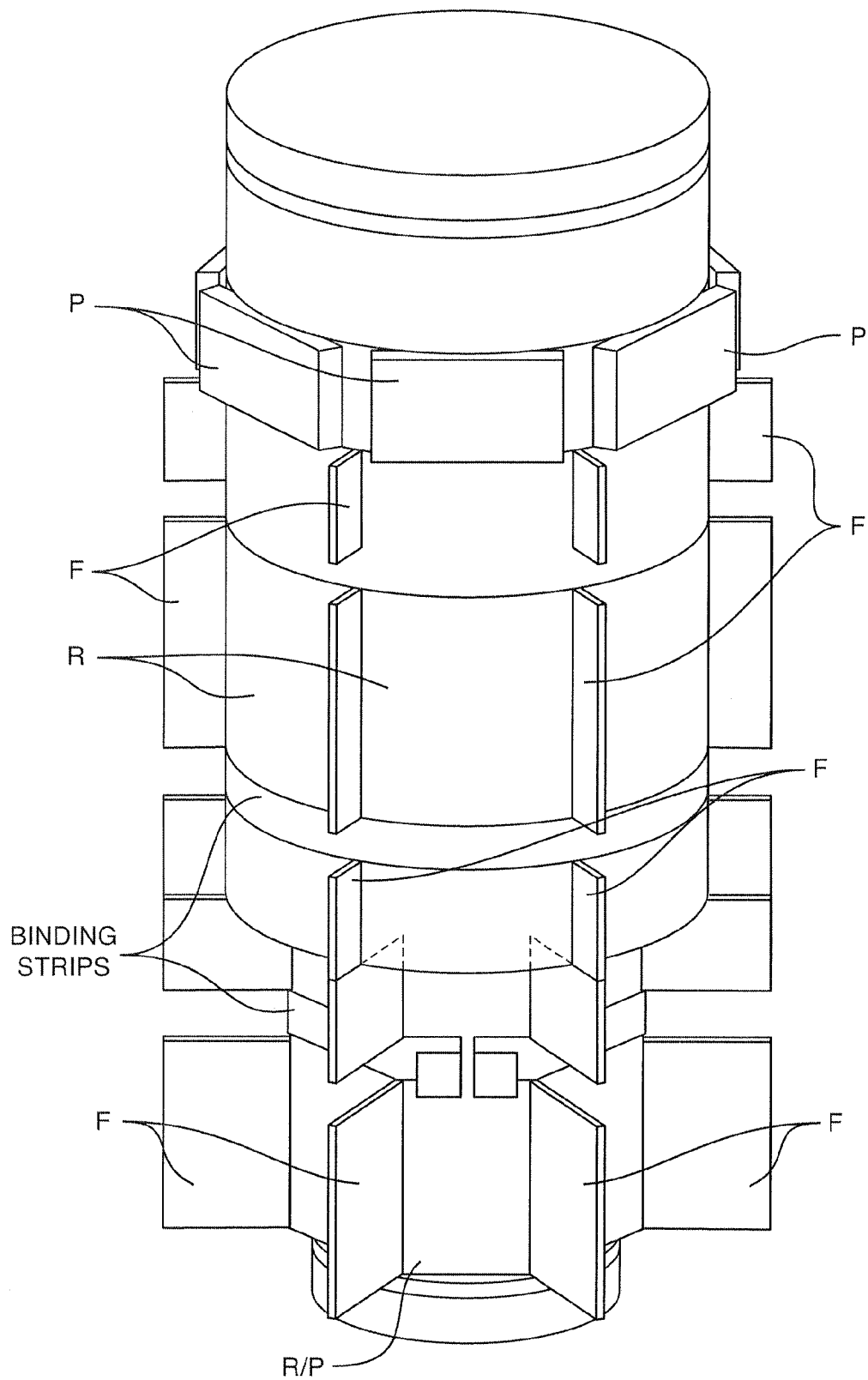
FIG. 4B is a perspective view of the stacked instrument modules showing the radiator fins, radiator plates and the mu-metal magnetic shield.
Figure 4C:
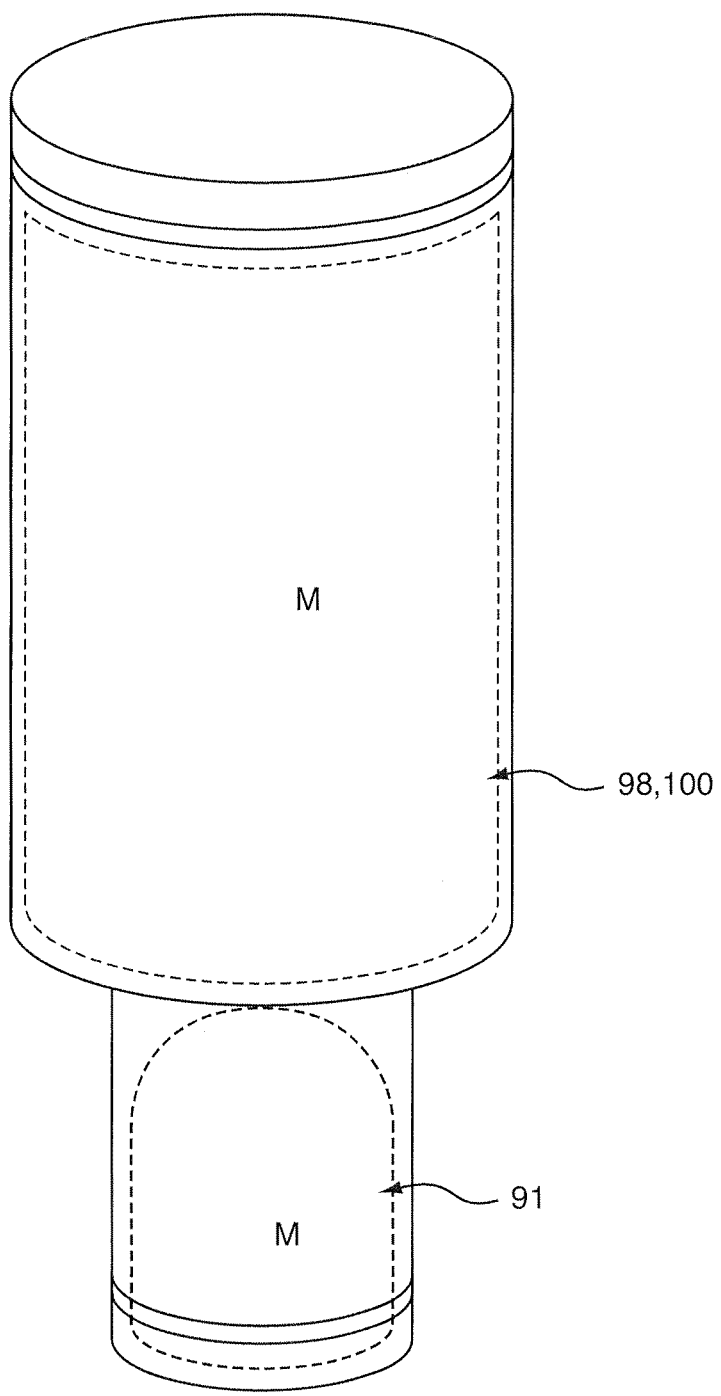
FIG. 4C is a perspective view of the stacked instrument modules with the radiator fins and plates removed and showing the exposed mu-magnetic shield.

Despite being a commercially available module, the PGS 91 cannot be used in a straightforward manner since it produces extremely high levels of electromagnetic noise. To solve this problem it is packaged along with its inverter and battery source 100b of the power module 98 all within a mu-metal shield M. This reduces its electromagnetic noise by a factor of about 1000. The PGS 91 has to be very rigidly coupled to the Platform 70. It also produces a significant amount of heat (~100 W) which has to be dissipated efficiently from the shielded unit. This has led to the design illustrated in FIGS. 4A, 4B and 4C. FIG. 4A shows that the bulk of the stem 71 is taken up by the stacked instrument modules 77 which includes the PGS 91 and its power module 98 which are held in the center of the stem 71 by a series of 18 bolts (not shown) that are threaded into stainless steel inserts in the wall of the stem 71. The bolts are arranged in a radially-symmetric pattern with three bolts located every 60 degrees in azimuth about the central axis and form a rigid coupling between the PGS 91, its power module 98 and the stem 71 while allowing a heat dissipation chimney in the form of an annular gap between the inner components and the inner wall of the stem 71. FIG. 4B shows a radiator R composed of a series of plates with cylindrical curvature that are clamped to the magnetic shield M by the pressure of the bolts. Fins F extend out from these plates at 90 degrees across an annular gap providing heat dissipation into the chimney. In FIG. 4C the radiator plates are removed exposing the mu-metal magnetic shield M. Furthermore, as shown in FIG. 4A, upper and lower sets of force distribution pads P are used to ensure that the instrument modules are tightly secured to the inside wall of the stem 71 by the collective inward pressure of the bolts. Each pad has a flat outer face to accept pressure from the bolts and an inner cylindrical surface to transfer the force evenly through the radiator plates and the mu-metal magnetic shield. Each lower force distribution pad accommodates two bolts and transfers force directly to the PGS while each upper force distribution pad accommodates one bolt and transmits force to the PGS power module 98.

Secondary Gyro Stabilizer Modules:

As mentioned above the invention also comprises at least one secondary gyro stabilizer module 78. The embodiment shown in FIG. 3C has two secondary gyro stabilizer modules 78, one of which is partially concealed behind one of the instrument platforms 70 vertical platform ribs 74. The two secondary gyro stabilizer modules 78 (Kenyon KS-8s) are required for two purposes. They are needed to resist rotational jitter about the axis of the platform 70 (yaw), i.e., the funnel axis 75, and to limit slow angular drift of the platform 70 in any direction due to small imbalances or to initial rotation rates of the assembly. One of the secondary gyro stabilizers 78 is modified due to the fact that the commercial gyro stabilizers for the cinema industry are band limited. They resist rapidly-applied torques about either of their two axes of resistance, but they do not resist steady torques applied over many seconds. This behavior is very desirable in cases where a camera must be allowed to pan in response to a steadily applied torque even while the gyro assembly resists vibration due to hand-shake or mechanical linkages to the moving vehicle. The magnetometers 79 used in this invention are not very sensitive to any slow drift of the Platform's 70 orientation. However, the platform 70 will cease to be stabilized if it reaches the limits of its roll and pitch travel (, i.e., roughly 20 degrees), so slow drift must be restrained. To achieve this, one of the two secondary gyro stabilizers 78 is modified so that the gimbals of its twin internal rotor assemblies are locked with the rotors spinning in the same direction. This in effect turns the gyro stabilizer 79 into a simple un-gimbaled gyro with its axis pointing along the axis of the platform 70. Because its angular momentum is fixed relative to the platform 70 it will allow the platform 70 to develop a slow precession rather than "falling over" in the event of a slight imbalance of the system.

The two secondary gyro stabilizers 78 are shown in FIG. 3C deployed on opposite sides of the stem 71 for the purposes of balance. Each gyro 78 is mounted inside a mu-metal shield 99 along with its inverter and battery 100b. The pair of gyros 78 stabilize the platform 70 against angular jitter in the yaw direction. These smaller gyros 78 dissipate much less heat than the primary gyro stabilizer 91. Heat dissipation is achieved passively by fins (not shown) attached to the mu-metal shields 99.

Dynamic Balancing System:

To minimize torques applied to the platform 70 by linear acceleration, the platform 70 needs to be well balanced in all three directions about its point of rotation. The platform 70 systems includes "soft" infrastructure such as cables, sealant etc. These components change in dimension and location slightly with their orientation relative to the g-vector (down direction), the temperature and the history of applied external accelerations. A dynamic balancing system 80 of FIG. 5A is therefore required to account for these small changes in the center of mass of the platform 70. The balancing system 80 is a controlled system of adjustable balance weights which allows trimming of the platform's 70 balance, whenever necessary.

A schematic of the dynamic balancing system 80 is shown in FIG. 5A. The system incorporates components on the floating instrumentation platform (circle) and the base assembly (rectangle) to which the platform is attached, as well as an off-platform PC. An embedded computer mounted on the instrument platform 70 controls three micro-balancers A1-A3 shown schematically in FIG. 5A and as laid out in FIGS. 3D and 3E. The micro-balancers are digitally-controlled linear actuators A, also shown schematically in FIG. 3A, that can precisely move a small mass of tens of grams through millimetric distances, in each of the three principal directions X, Y and Z.

The information necessary for determining the required changes in positions of the balancers includes the EMI data from the primary sensors as well as measurements from an Attitude and Heading Reference System (AHRS) also located on the platform. In the present embodiment the balancing algorithm is executed on a PC running off-platform which logs the EMI data wirelessly directly from the DAQ system, while the AHRS data are communicated by a separate wireless link from the embedded computer. Commands are issued by the balancing algorithm and signaled wirelessly to the embedded computer on the platform which repositions the balance masses. Alternatively the tasks currently being accomplished by the off-platform PC, could be achieved by an embedded computer of higher performance running directly on the platform with either a wired or wireless data link from the primary EMI sensors.

3-axis fluxgate DC magnetometer which is part of the AHRS system measures the orientation of the Earth's magnetic field relative to the platform 70 and hence relative to each of the principal sensors 79. This information provides the sensitivity of the principal sensors 79 to rotations about each of three axes.

The precision of the balancing process is enhanced by applying vibration to the base by operating 3 mutually-perpendicular, linear non-magnetic pneumatic vibrators V1, V2 and V3 shown in FIG. 5A. These are located within the support pedestal 54 just below the air bearing 55 as shown at V in FIG. 2C. The vibrators are operated at 3 different narrowly-separated frequencies around a base frequency, for example 90 Hz with the frequency spread controlled by differential pressure from a common pneumatic manifold. Imbalance of the platform will manifest as a corresponding narrow-band noise signal on each of the sensor components in proportion to their rotational sensitivity. Combining the fluxgate signals with streaming data from the principal sensors 79, a non-linear optimization algorithm executing on an off-platform PC will allow the embedded computer on the platform 70 or other computer to optimize the position of the balancers, i.e., the actuators A in FIG. 3A or particularly, actuators A1, A2 and A3 in FIGS. 3D, 3E and 5A, and thus minimize measurement noise. A number of algorithms were considered with a preferred algorithm being outlined later in this disclosure.

In particular, FIG. 5A shows the dynamic balancing system which balances the rotatable platform about three different axes. When out of balance, the center of mass of the platform is different from its common center of rotation. Vibrations in the base then cause rotations of the platform which register as magnetic signals in each of the three orthogonal magnetometers on the platform. The pneumatic vibrators V1, V2 and V3 on the base are driven at three distinct frequencies. The three linear electro-mechanical actuators A1, A2 and A3 on the platform adjust balance masses in a feedback loop.

Figure 5B:
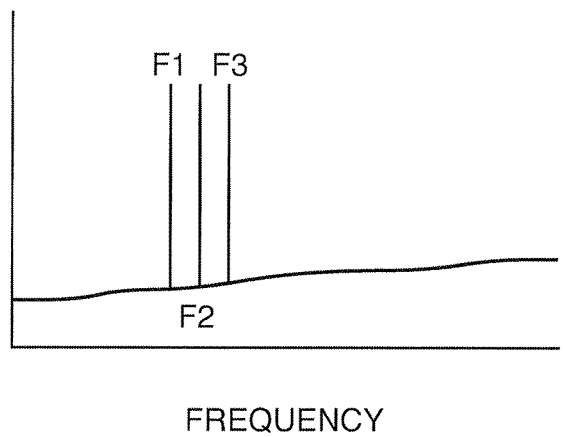
FIGS. 5B and 5C show respectively the spectral intensities of the vibrations of the pedestal imposed by the mutually-orthogonal pneumatic and the resulting spectral intensities of the signals from the three magnetometers mounted on the instrument platform.
Figure 5C:
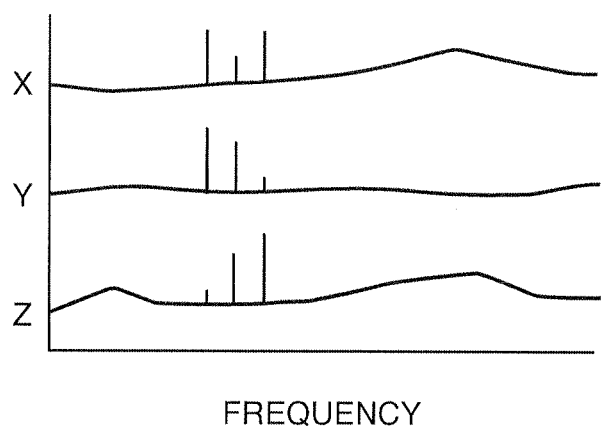

FIG. 5B is a graph showing the vibration imposed on the pedestal by the three orthogonal pneumatic vibrators V1, V2 and V3, each running at a different frequency, f1, f2 and f3. The distinct frequencies are determined by three pressure step down valves each feeding a different vibrator from a common manifold and FIG. 5C illustrates signals from the three AC magnetometers on the platform registering signals due to vibration of the base at the three different frequencies. These signals vanish when the platform has its center of mass located exactly at the center of rotation. The mass-balance is controlled in feedback via the three orthogonal electro-mechanical actuators A1, A2 and A3 each controlling the position of a balance mass on a carriage on the apparatus.

A two-way wireless link between the embedded computer and the off-platform PC of FIG. 5A allows for data from the AHRS and position information from the actuators A to be relayed to the off platform PC while control information relating to the actuators A is relayed back.

The algorithm is necessary for the dynamic balancing to work and although any known algorithm which can balance a system like that of the present invention may be used, the preferred embodiment uses a specific and unique algorithm. The steps of the unique algorithm employed by the preferred embodiment are as follows:

a) The program receives a continuous stream of data from the three primary sensors at a high rate as well as receiving data from the fluxgate magnetometer which is part of the on-platform AHRS system at a much slower rate.

b) From the slow fluxgate data, the algorithm determines the orientation of each of the three sensors with respect to the earth's magnetic field. Because of the rotational stability of the platform, this will be very slowly changing.

c) From this information, a 3×3 matrix is computed which will transform the raw primary sensor components into three virtual directions; those being Ca in the direction of the earth's magnetic field, Ch horizontal and perpendicular to the earth's magnetic field and the third component Cv perpendicular to both.

d) The primary sensor data collected over a time interval ranging from one second to tens of seconds are Fourier transformed to get their complex spectra.

e) The spectra from the three raw components are multiplied by the computed 3×3 matrix to get the spectra in the Ch and Cv directions. These are the most sensitive to vibrational noise.

f) The transformed power spectral densities (PSDs) are formed in the Ch and Cv directions by multiplying the complex spectra by their complex conjugates.

g) The Ch and Cv PSDs are averaged over three narrow frequency bands corresponding to the frequencies of pedestal vibration producing six spectral amplitudes that are positive real numbers.

Furthermore, the simplest variant of the algorithm of the present invention follows although more refined approaches are possible.

h) A single objective function to be minimized is created by taking the sum of the 6 PSDs.

i) This objective function is used as the input to a standard non-linear three-dimensional simplex optimization algorithm such as the downhill simplex method. The result of each application of this is the suggested next set of locations for the mass balancers.

j) The new positions are requested of the onboard embedded computer by wireless transmission and time is given for them to achieve their new positions. The entire algorithm is iterated.

The algorithm outlined above has as its sole criterion the balance of the platform. However it can be easily modified to provide a small bias required to keep the platform roughly upright and well within its angular range of operation. This can be achieved by adding to the objective function of (g) a term consisting of a weighting coefficient times the angular deviation from the vertical of the axis of the platform as obtained from the AHRS data. The magnitude of the weighting coefficient can be determined by experiment or analysis to maintain trim of the platform while keeping the noise induced by the imbalance bias below an acceptable level.

The Air Bearing:

A preferred embodiment of the stabilization system 10 according to the present invention employs a spherical air bearing 55 which provides, to the tolerance of precision machining, a single point of common rotation about any axis which is also very low friction. In the face of accelerations and thermal changes, it would be much more difficult to achieve and maintain a comparable degree of balance by using the more traditional solution of three gimbal bearings supported by nested yokes.

However, the role of the air bearing 55 can be filled by any type of bearing which will allow for the requisite pitch and yaw of the instrument platform 70 and at the same time will not interfere, taint, contaminate or negatively affect in any way the collection of field data, in particular electromagnetic data.

Referring to FIGS. 6A to 6C, the spherical air bearing 55 comprises a source of compressed air or gas FIG. 6C which is connected and supplies air to the a supporting concave section of the bearing so that a top supported hemisphere section of the bearing floats on a cushion of air or gas. The source or means of providing compressed air 57 to the air bearing can be accomplished for example, by an air or gas compressor having sufficient pressure and flow rate so that it can provide the volume of air or gas which will support the weight of the platform 70 when it is fully loaded with its instruments and equipment.

The air bearing 55 is custom designed for the present invention. It provides for over 25 degrees of rotation in roll and pitch, and infinite rotation in yaw about a highly-precise single point of rotation. The air bearing 55 is a metal object located relatively close to the sensors. Thus, eddy currents induced in the bearing may have to be accounted for in the received signal. To minimize that possibility, the bearing 55 was manufactured of a stainless steel of relatively low conductivity (#303). Additionally as illustrated by FIGS. 6A and 6C, a cross-pattern of deep grooves G was milled into the back of both the supporting concave bearing and the supported hemisphere. Tests have shown the time constant of the principal eddy current mode to be about 1 millisecond. Alternatively, the bearing could be manufactured of a machineable ceramic such as MACOR which would be more expensive but would eliminate the eddy currents entirely.

Base:

As best illustrated by FIGS. 1A, 2A and 2B, the base assembly 50 carries the load of the platform 70 from the air bearing 55 and its pedestal 54 to the suspension ring 51 which sits in a plane running through the center of mass of the combined platform 70 base 50 system. The structure is necessarily quite large and must be highly rigid, light weight and easy to transport to the survey site. To achieve the required rigidity in a de-mountable structure, the pedestal base 53 and the suspension ring 51 are connected by light-weight ribs 52 of sandwich cored carbon fiber composite and strengthened by thin diagonal braces 56a, 56b. The ribs 52 connect the suspension ring 51 to the base plate 53 and are shaped so as to accommodate a 20 degree roll and pitch range of the platform 70 relative to the pedestal axis. The ribs 52 extend through slots 60 in base plate floor where they are each sandwiched between pairs of ribs 52 permanently attached to its underside. In this way a rigid connection can be made while allowing the base 50 to be disassembled for transport into individual ribs 52, braces 56a, 56b, the base plate 53, the suspension ring 51 and the pedestal 54.

Damper System:

The damper system shown in FIG. 1A comprises a plurality of vibration isolating dampers 40 which collectively isolate the base 50 from linear accelerations of the housing 20. Achieving a high degree of isolation at frequencies as low as 1 Hz requires accommodation of a large displacement. In the design presented here, there are eight dampers 40 of two kinds. The first set, i.e., the vertical dampers 42 are required to bear the static load of the base 50 as well as accommodate dynamic loading. The second set of dampers are oriented horizontally, i.e., the horizontal damper 44, and are required to accommodate primarily lateral dynamic loading. A number of devices have been considered including bungees, air bags, springs, air-bearing struts and custom-shaped blocks of energy-absorbing rubber such as Sorbothane. Each of these has advantages and disadvantages. Some work best in tension while others work best in compression. Both types of dampers can be realized within the limits of the proposed geometry by modifying the layout and nature of the support brackets.

Frame:

The tow frame 30 is illustrated in FIGS. 1C, 1B and 1A. The role of the frame 30 is to provide a common attachment structure for the plurality of vibration isolating dampers 40, the helicopter tow cable and the housing 20. It is to be constructed using hollow composite channels. Because of its large size, it needs to be designed to be assembled on site from six individual pieces. The frame 30 will also be the site of the wireless receivers for the data acquisition 90 and the dynamic balancing systems 80.

Housing:

The housing which is best shown in FIG. 1B, is a teardrop-shaped composite shell of dimensions 2.8 m×4.3 m to be constructed of four identical quadrants each the full 4.3 m length. The sections will have an intermediate dimension of about 2 m and can be easily transported in a standard-width cube van. Using well established hollow-cored construction methods, the shell sections can be constructed of carbon composite. The sections can be bolted together through externally-projecting flanges integral to each section. The total weight of the shell is estimated to be less than 50 kg.

The two point suspension of the housing 20 will restrict rotation of the shell around its longitudinal axis. When lifted by a helicopter, prior to significant forward motion with airflow, the attitude or pitch of the bird is unconstrained. The location of the center of gravity of the housing 20 and downwash from the helicopter rotors will likely lead to a tail-down orientation. Once forward speed has been achieved by the helicopter, aerodynamic forces take over and directional stability in terms of pitch and yaw can be controlled by the shape of the housing 20 and supplemental fins. To accommodate this range of pitch motion the housing 20 has been designed to rotate independently of the enclosed instrument platform 70 and avoid the risk of exceeding the range of rotation permitted for the gyro stabilization. The internal assembly, i.e., the base 50 and instrument platform 70 will be maintained in an upright position by means of slight bottom-weighting.

The purpose of the housing 20 is to provide protection from the elements and an aerodynamic shape that minimizes turbulence that could create vibration and drag. The shape of the housing 20 will minimize turbulent flow and provide a degree of directional stability with respect to the apparent wind direction that is generally aligned with the direction of flight. Horizontal and vertical stabilizers may be added to increase the rotational responsiveness to changes in apparent wind direction. Turbulence during flight may suddenly modify the apparent wind direction and too much stabilizer surface will increase sensitivity to such disturbances. The elongated shape of the housing 20 will provide a basic level of directional response and the flexibility of selecting different stabilizer fins will facilitate fine tuning the flight characteristics.

The housing 20 is designed to be a rigid lightweight skin, adequate to meet the aerodynamic forces but not to support the full weight of the housing 20 and internal components. Therefore a three point support/landing gear assembly will be enclosed within it. The support system will attach to the axles on either side of the frame 30 and terminate with 3 feet protruding through the housing 20 that will support the systems weight during assembly and landing. Anticipating that the housing 20 will be tail down when the helicopter is hovering during landing, a small keel will be provided along the lower seam from tail to landing gear to minimize contact of the housing with the ground and the possibility of puncture. Although the housing 20 need not have any internal structure it may comprise four ribs, i.e., one top rib, one bottom rib or keel, one starboard rib and one port rib. This would make assembly easier and provide mounting points for stabilizer fins. In concept the landing gear structure and four ribs would be assembled first. The instrument platform 70, lifted by the frame 30, would be connected via the axles. The final step would be the addition of the housing 20 skin sections.

Unique Features:

The following features are thought to be unique or at least unusual in the airborne geophysics industry.

1. While operating in a mobile, flyable housing 20, the system will continuously record magnetic field data in the bandwidth of 1 Hz to 25 Hz of suitably low motion-induced noise so as to be useful for exploration purposes.

2. The platform 70 is rotationally-stabilized to a high degree using a system of rotational isolation that has no dampers or restoring forces so the sensors 79 maintain orientation relative to the static magnetic field of the earth. For this reason platform 70 is mounted on a low friction air bearing 55 on the base 50. This minimizes torque applied to the platform 70 caused by rotations of the housing 20.

3. A dynamic balancing system incorporating active vibration, an on-board computer and a set of remotely adjustable weights is utilized which ensures that the center of mass remains located at the precise center of rotation of the air bearing. This minimizes torque applied to the platform 70 that would otherwise arise from variations in linear acceleration of the housing 20.

4. The dynamic balancing algorithm of 5. which maintains the instrumentation platform 70 in a roughly vertical orientation.

5. The base 50 is mounted on acceleration and vibration dampers 40 that provide significant damping to 1 Hertz in order to minimize any torques applied to the platform 70 due to linear accelerations of the housing 20.

6. Three compound gyros 78 and 91 are used to enhance pitch, roll and yaw stability.

7. The platform 70 is very rigid utilizing carbon fibre sandwich core construction, so the orientation maintained by the gyros 91, 78 is accurately transferred to the sensors 79.

8. The gyros 91, 78 and associated electrical components are magnetically shielded to minimize interference with the sensors 79.

9. The principal gyro 91 is wrapped with a heat sink that uses passive convection to remove excess heat.

10. Data acquired by the sensors 79 are transmitted wirelessly from the rotatable platform 70 to data processing and recording system attached to the frame 30.

While in accordance with the provisions of the statute, there is illustrated and described herein specific embodiments of the invention. Those skilled in the art will understand that changes may be made in the form of the invention covered by the claims and that certain features of the invention may sometimes be used to advantage without a corresponding use of the other features.

What is claimed is:

1. A stabilized field sensor apparatus (10) for collecting field data with reduced motion noise, comprising:

a tear drop shaped housing (20) having a bulbous front portion, a pointed rear end, a first front-to-back horizontal axis (22) and a second side-to-side horizontal axis (24);

a tow frame (30) in the bulbous end of the housing, the tow frame having a base ring (32), two crossing arcuate bars (34a, 34b) each with opposite ends connected at spaced locations to and around the base ring, and two horizontal axles (36a, 36b) laying on the second horizontal axis (24) of the housing (20) and protruding from opposite ends of one of the bars (34a), the axles protruding from opposite sides of said base ring and out through opposite sides of the bulbous portion of the housing for attaching the apparatus to a vehicle for carrying the apparatus, the axles being pivotally connected to the housing and the frame being sized for free relative rotation of the frame in and to the housing about the second horizontal axis (24);

a plurality of vibration isolating dampers (40) connected to and spaced around the tow frame (30), the dampers being effective for dampening vertical and horizontal vibrations of the tow frame;

a base assembly (50) mounted to the plurality of vibration isolating dampers (40) and positioned at least partly in the tow frame (30) and entirely in the bulbous portion of the housing (20) for free movement of the base assembly in the housing when the tow frame pivots about the second horizontal axis (24) of the housing (20), vertical and horizontal vibrations of the housing and frame being dampened by the dampeners before reaching the base assembly (50);

a support pedestal (54) having a bottom end fixed to the base assembly (50) near a bottom of the base assembly, the support pedestal extending upwardly in the base assembly and into the tow frame (30) and having an upper free end spaced inwardly from the tow frame;

a single spherical air bearing (55) connected to the upper free end of the pedestal;

a structurally rigid instrument platform (70) having a lower hollow cone portion (72) with an upper inside apex engaged to and supported on the spherical air bearing (55) for a rotatable and pivotal support of the instrument platform on the support pedestal, the instrument platform having an upper stem (71) extending upwardly of the cone portion, above the apex and into the tow frame (30), the instrument platform (70) having a central axis (75) extending through the cone portion and the stem;

a dynamic balancing system (80) for dynamically balancing the platform on the air bearing; and at least one field sensor (79) mounted to the instrument platform (70) for collecting field data while being balanced against motion noise including vibration, pivoting and rotation from the base assembly, from the tow frame and from the housing.

2. The apparatus of claim 1, including a principal gyro stabilizer (91) mounted to the stem (71) and positioned on the central axis for reducing rotational jitter in roll and pitch of the instrument platform on the support pedestal and at least one secondary gyro stabilizer (78) mounted to the instrument platform at a location spaced radially from the central axis (75) for reducing rotational jitter in yaw.

3. The apparatus of claim 1, wherein the base assembly (50) comprises a suspension ring (51) connected to the vibration isolating dampers (40), a base plate (53) spaced below the suspension ring and having a plurality of circumferential spaced radially extending slots (60), a plurality of base ribs (52) connected between the suspension ring and the base plate and spaced around the base plate and suspension ring, each base rib (52) having a lower radially outwardly extending arcuate portion (52a) extending through one of the slots (60) in the base plate (53) and an inwardly inclined portion (52b) connected between the arcuate portion of the base rib and the suspension ring, a plurality of lower diagonal braces (56a) each connected between a lower end of each base rib and an intermediate location of an adjacent base rib, and a plurality of upper diagonal brace (56b) each connected between an upper end on each base rib and the intermediate location on the adjacent base rib, the diagonal braces increasing torsional rigidity of the base assembly (50), the support pedestal (54) having an upper portion above the base plate (53) and a lower portion below the base plate, a lower end of each base rib (52) being connected the lower portion of the support pedestal (54).

4. The apparatus of claim 1, wherein the base assembly (50) comprises a suspension ring (51) connected to the vibration isolating dampers (40), a base plate (53) spaced below the suspension ring and having a plurality of circumferential spaced radially extending slots (60), the plurality of base ribs (52) connected between the suspension ring and the base plate and spaced around the base plate and suspension ring, each base rib (52) having a lower radially outwardly extending arcuate portion (52a) extending through one of the slots (60) in the base plate (53) and an inwardly inclined portion (52b) connected between the arcuate portion of the base rib and the suspension ring, a plurality of lower diagonal braces (56a) each connected between a lower end of each base rib and an intermediate location of an adjacent base rib, and a plurality of upper diagonal brace (56b) each connected between an upper end on each base rib and the intermediate location on the adjacent base rib, the diagonal braces increasing torsional rigidity of the base assembly (50), the support pedestal (54) having an upper portion above the base plate (53) and a lower portion below the base plate, a lower end of each base rib (52) being connected the lower portion of the support pedestal (54), and a pair of reinforcing plates (61) on opposite sides of each base rib at a location below the base plate (53), the suspension ring, the ribs and the base plate being made of sandwich cored carbon fiber composite.

5. The apparatus of claim 1, including a principal gyro stabilizer (91) mounted to the stem (71) and positioned on the central axis for reducing rotational jitter in roll and pitch of the instrument platform on the support pedestal and at least one secondary gyro stabilizer (78) mounted to the instrument platform at a location spaced radially from the central axis (75) for reducing rotational jitter in yaw, the stem portion (71) and the cone portion (72) of the instrument platform (70) each comprising a single piece of sandwich cored carbon composite material, the stem portion (71) containing a plurality of stacked instrument modules (77) including the principal gyro stabilizer (91), a data acquisition system (90) and a power module (98) comprising an inverter and battery (100a), the instrument platform (70) including a plurality of circumferentially spaced vertical stiffening platform ribs (74) extending along the cone portion (72) and the stem (71), and a plurality of horizontal reinforcing flanges (73) expending around the platform and past the platform ribs, the apparatus including a pair of weight-balanced secondary gyro stabilizers (78) mounted on opposite sides of the stem and on one of the horizontal reinforcing flanges (73).

6. The apparatus of claim 1, wherein the field sensor (79) comprises a feedback induction coil for collecting magnetic field data including low frequency magnetic measurements in a bandwidth of 1 Hz to 25 Hz.

7. The apparatus of claim 1, wherein the field sensor (79) comprises feedback induction coils for collecting magnetic field data including low frequency magnetic measurements in a bandwidth of 1 Hz to 25 Hz, the apparatus including three of said sensors mounted at equally spaced locations around the cone portion, each comprising a vector component sensor (79) situated adjacent the lower rim of the cone and each having a longitudinal axis parallel to the cone surface and coplanar with the axis of the cone.

8. The apparatus of claim 1, wherein each vibration isolating dampers (40) comprises a set of vertical dampers (42) which suspend the base assembly from the arcuate bars (34a, 34b) of the frame, and horizontal dampers (44) which laterally connect cone portion to the base assembly (50) to the base ring (32) of the frame (30).

9. The apparatus of claim 1, wherein the base ribs (52) of the base assembly (50) are angled to accommodate a 10 to 30 degree roll and pitch range of the instrument platform (70) on the spherical air bearing (55).

10. The apparatus of claim 1, including a principal gyro stabilizer (91) mounted to the stem (71) and positioned on the central axis for reducing rotational jitter in roll and pitch of the instrument platform on the support pedestal and at least one secondary gyro stabilizer (78) mounted to the instrument platform at a location spaced radially from the central axis (75) for reducing rotational jitter in yaw, the gyro stabilizers being mounted to the instrument platform (70) inside a metal of high magnetic permeability (99), along with an inverter and a battery (100b).

11. The apparatus of claim 1, further comprising a dynamic balancing system (80) comprising a PC separate from the apparatus, a set of linear mass-balance actuators (A) mounted on the instrument platform (70) and oriented at 90 degrees to each other, as well as an embedded computer mounted on the instrument platform (70) which receives instructions from the PC for controlling the set of mass-balance actuators (A).

12. The apparatus of claim 1, further comprising: a dynamic balancing system (80) comprising an embedded computer mounted on the platform (70); a PC separate from the apparatus; a dynamic balancing algorithm executing on the PC; a set of three mutually-perpendicular linear pneumatic vibrators (V) contained within the support pedestal (54) below the air bearing (55); each of the three mutually-perpendicular linear pneumatic vibrators (V) vibrating at a different frequency allowing the dynamic balancing algorithm to create information on how to more accurately determine the required re-distribution of mass, the dynamic balancing system further comprising a means of wirelessly conveying the information created by the dynamic balancing algorithm executing on the PC to the embedded computer.

13. A sensor stabilization device (10) to facilitate continuous collection of magnetic field data including low frequency magnetic measurements in the bandwidth of 1 Hz to 25 Hz without being affected by motion noise, said device (10) comprising:
a tear drop shaped housing (20);
a tow frame (30) comprising a base ring (32), two raised, convex cross bars (34a, 34b) connected to said base ring (32), and two horizontal axles (36a, 36b) protruding out from one of the two cross bars (34a, 34b) and positioned on opposite sides of the base ring (32), each of said two horizontal axles (34a, 34b) being pivotally connected to said housing (20) by reciprocal bearings (32a, 32b) and each of said two horizontal axles (34a, 34b) penetrating the housing (20) through said reciprocal bearings (32a, 32b), the horizontal axles (36a, 36b) forming tow points which facilitate attachment to a vehicle;
a base assembly (50) connected to the frame but vibrationally isolated from the housing (20) and from the frame (30), the base assembly comprising a support pedestal (54) having a bottom end integral with a circular base plate (53) which has an underside (62), the support pedestal (54) having an opposite top end with a single spherical air bearing (55) comprising a center of rotation, the base assembly (50) further comprising a suspension ring (51), a plurality of vertical ribs (52) connected to the circular base plate (53), said ribs (52) being radially angled and extending through slots (60) in said circular base plate (53), said vertical ribs (52) being sandwiched between pairs of ribs (61) permanently attached to said underside (62) of said base plate (53), said base assembly (50) also comprising diagonal carbon fiber braces (56) for increasing torsional rigidity and which connect adjacent members of said plurality of vertical ribs (52) to each other;
a hollow funnel-shaped rotationally stabilized instrument platform (70) comprising a single piece of sandwich cored carbon composite material, said platform having a longitudinal axis (75), a center of mass and an outer surface, said platform (70) being supported in an inverted fashion on said single spherical air bearing (55) and on the support pedestal (54), the platform (70) comprising a stem portion (71) and a cone portion (72), said cone portion having a lower rim, the stem portion containing a series of stacked instrument modules (77) comprising a data acquisition system (90), followed by a principal gyro stabilizer (91), followed by a power module (98) comprising an inverter and battery (100a);
three vector component magnetometers (79) each having a longitudinal axis, the magnetometers (79) being mounted on said outer surface of said cone portion (72) adjacent said lower rim, the instrument platform (70) comprising longitudinal ribs (74) fixedly attached to the outer surface of said stem portion (71) and cone portion (72) for additional rigidity to said platform (70);
two secondary opposite gyro stabilizers (78) for resisting rotational jitter and rotational motion about the axis (75) of the platform (70), mounted on the platforms (76) and positioned radially outwardly of the axis (75) of the platform, on either side of said stem portion (71), said two secondary gyro stabilizers (78) being mounted inside a mu-metal shield (99) along with an inverter and a battery (100b),
a dynamic balancing system (80) for ensuring that the platforms (70) center of mass is located at the center of rotation of the air bearing, the dynamic balancing system (80) comprising a set of linear mutually-perpendicular actuators (A) each having a small mass located on a small linear carriage; a set of linear pneumatic mutually-perpendicular vibrators (V) each vibrating at a different frequency; a PC separate from the device; a dynamic balancing algorithm executing on the PC; an embedded computer mounted on the platform (70) for controlling the set actuators (A); and a means of conveying information wirelessly from the PC to the embedded computer; wherein the embedded computer on the platform receives position instructions wirelessly from the dynamic balancing algorithm executing on the PC;
a vibration isolating damper system (40) for isolating the base assembly (50) and the platform (70) from vibrations and rotations of the housing (20), said damper system (40) comprising vertically-oriented dampers (42) for suspending said base from said cross bars (34a, 34b) of the frame, and horizontal dampers (44), for laterally connecting said base assembly (50) to said base ring (32) of the frame (30);
said radial ribs (52) of said base assembly (50) being angled to accommodate a selected amount of roll and pitch range of said instrument platform (70).

14. A stabilized field sensor apparatus for collecting field data with reduced motion noise, comprising:
a housing (20);
a tow frame (30) in the housing (20);
a base assembly (50) mounted to the dampers (40);
a support pedestal (54) having a bottom end fixed to the base assembly (50) and an upper free end;

a single spherical air bearing (55) connected to the upper free end of the pedestal (54);

an instrument platform (70) with a lower hollow funnel having an upper inside apex supported on the air bearing (55) for a one point support and having a central axis (75);

a dynamic balancing system (80) for dynamically balancing the platform on the air bearing; and at least one field sensor (79) mounted to the instrument platform (70) for collecting the field data while being stabilized against motion noise including vibration, pivoting and rotation from the base assembly (50), from the tow frame (30) and from the housing (20).

15. A stabilized field sensor apparatus for collecting field data with reduced motion noise as claimed in claim 14, further comprising a plurality of gyro stabilizers (91, 78) connected to the instrument platform (70) for maintaining pivotal and rotational stability.

16. A stabilized field sensor apparatus for collecting field data with reduced motion noise as claimed in claim 14, the spherical air bearing (55) comprising a concave supporting section and a supported hemisphere section, wherein both the concave supporting section and the supported hemisphere section comprise a cross section of milled grooves (G) to minimize eddy currents induced by the spherical air bearing.

17. A stabilized field sensor apparatus for collecting field data with reduced motion noise as claimed in claim 14, wherein the instrument platform (70) comprises an upper stem portion (71) having an outside surface and a lower cone (72) portion having also having an outside surface as well as a lower rim.

18. A stabilized field sensor apparatus for collecting field data with reduced motion noise as claimed in claim 14, wherein the spherical air bearing (55) comprises a source of compressed air or gas (57) connected to the concave supporting section for supplying air to the concave supporting section so that the supported hemisphere floats on a cushion of air.

19. A stabilized field sensor apparatus for collecting field data with reduced motion noise as claimed in claim 15, wherein the plurality of gyro stabilizers (91, 78) comprising one principal gyrostabilizer (91) contained within the stem portion (71) of the instrument platform (70), and two secondary gyro stabilizers (78) mounted to and equally spaced around the outside surface of the stem portion (71) of the instrument platform.

20. A stabilized field sensor apparatus for collecting field data with reduced motion noise as claimed in claim 19, wherein the gyro stabilizers are mounted inside a metal enclosure of high magnetic permeability (99).

21. A stabilized field sensor apparatus for collecting field data with reduced motion noise as claimed in claim 20, comprising three field sensors each of which having a longitudinal axis and being mounted and equally spaced apart on the outside surface of the cone portion (72) of the instrument platform (70), wherein the three field sensors (79) are positioned adjacent the lower rim of the cone portion (72) and so that their longitudinal axes are coplanar with the central axis (75) of the instrument platform (70).

* * * * *